United States Patent
McFarland et al.

(10) Patent No.: US 12,191,922 B1
(45) Date of Patent: Jan. 7, 2025

(54) SYSTEMS, APPARATUSES, AND METHODS FOR TESTING, ANALYZING, AND ASSEMBLING RF MODULES

(71) Applicant: Cobham Advanced Electronic Solutions Inc., Arlington, VA (US)

(72) Inventors: Merrill Durand McFarland, Santa Clara, CA (US); Daniel Alan Herzfeldt, Pleasanton, CA (US); Shane Dixon, Broomfield, CO (US)

(73) Assignee: CAES SYSTEMS LLC, Arlington, VA (US)

( * ) Notice: Subject to any disclaimer, the term of this patent is extended or adjusted under 35 U.S.C. 154(b) by 80 days.

(21) Appl. No.: 18/084,193

(22) Filed: Dec. 19, 2022

Related U.S. Application Data

(63) Continuation of application No. 18/084,124, filed on Dec. 19, 2022.

(51) Int. Cl.
| | |
|---|---|
| *H04B 3/36* | (2006.01) |
| *H04B 17/00* | (2015.01) |
| *H04B 17/17* | (2015.01) |
| *H04B 17/309* | (2015.01) |
| *H04Q 1/20* | (2006.01) |

(52) U.S. Cl.
CPC ......... *H04B 17/17* (2015.01); *H04B 17/0085* (2013.01); *H04B 17/309* (2015.01)

(58) Field of Classification Search
CPC .. H04B 17/17; H04B 17/309; H04B 17/0085; G01R 35/007; H04L 43/12
USPC .......................... 375/224–228, 219, 220, 222
See application file for complete search history.

(56) References Cited

U.S. PATENT DOCUMENTS

| | | | |
|---|---|---|---|
| 2014/0167794 A1* | 6/2014 | Nath | ..................... G01R 35/007 324/750.02 |
| 2018/0131596 A1* | 5/2018 | Huh | ......................... H04L 43/12 |

* cited by examiner

*Primary Examiner* — Phuong Phu
(74) *Attorney, Agent, or Firm* — ALSTON & BIRD LLP

(57) ABSTRACT

Systems, apparatuses, and associated methods are provided for testing, analyzing, and assembling radiofrequency (RF) modules. An example system includes a test station for testing an RF module, including testing mechanical, chemical, and/or electrical parameters of the RF module. The testing may involve various sources of error, and the system determines one or more types of error from the test results as well as how to address the error. From completed testing, test results may be utilized in view of expected test results to improve simulations and to determine how two or more RF module may be combined in an RF assembly.

17 Claims, 9 Drawing Sheets

SYSTEMS, APPARATUSES, AND METHODS FOR TESTING, ANALYZING, AND ASSEMBLING RF MODULES

CROSS-REFERENCE TO RELATED APPLICATIONS

This application is a continuation of and claims priority to U.S. patent application Ser. No. 18/084,124, filed Dec. 19, 2022, the entire contents of which is incorporated by reference herein for all purposes.

TECHNOLOGICAL FIELD

Embodiments of the present disclosure relate generally to testing, analyzing, and assembling RF (radio frequency) modules associated with the transmission and reception of RF signals, such as via antennas.

BACKGROUND

Electronics for transmission and reception of radio signals are used in a variety of applications, including navigation and military applications, in which electromagnetic radiation (e.g., radio frequency waves) are transmitted and/or received. As an example, radio waves may be used in RADAR (radio detection and ranging) applications to locate and track objects. The electronics supporting the transmission and receipt of these signals may include one or more RF modules that must meet strict requirements to support their applications. The RF modules may house multiple electronics and require precision manufacturing, tuning, and assembly, particularly when the requirements for the end application are stringent. Exemplary requirements include both physical and electrical parameters, such as shape, size, weight, noise, gain, distortion, and/or filtering. It is challenging to integrate multiple mechanical and electrical functions within the limited space allowed, and the challenges in integration create challenges in manufacturing the RF modules, which include identifying and accounting for one or more sources of error. While the design and development of RF modules is performed to meet stringent requirements, it would be beneficial to account for variations introduced during manufacturing, tuning, and testing to develop effective ways to meet the requirements while accounting for variations and addressing process errors. The testing of RF modules may include multiple sources of error which are difficult to identify and address. The inventors have identified numerous areas of improvement in the existing technologies and processes, which are the subjects of embodiments described herein.

BRIEF SUMMARY

In general, embodiments of the present disclosure provided herein provide for systems, apparatuses, and methods for testing, analyzing, and assembling RF modules. Other implementations will be, or will become, apparent to one with skill in the art upon examination of the following figures and detailed description. Additionally, variations in processes described, including the omission or addition of operations, which will be apparent to one with skill in the art upon examination of the following. It is intended that all such additional implementations be included within this description be within the scope of the disclosure and be protected by the following claims.

In accordance with some embodiments of the present disclosure, an apparatus is provided. The apparatus comprising at least one processor and at least one memory coupled to the processor, wherein the processor is configured to: receive, via a network, a plurality of test data objects, wherein each test data object is comprised of test result data generated by one of a plurality of RF module test stations, and wherein each test data object is associated with one RF modules and one RF module test station of the plurality of RF module test stations; generate, based on each test data object, a determination of whether there is an error associated with a test of one or more of the RF modules; and generate, upon the determination that there is an error, an indication of a source of error.

In some embodiments, the determination of whether there is an error is based on one or more trends based on the test result data of each test data object.

In some embodiments, the processor is further configured to: generate a visualization of the source of error based on the test data object associated with the source of error and the plurality of test data objects not associated with the source of error; and transmit, via an electronic communication, an alert comprising the visualization to a user device.

In some embodiments, the determination of whether there is an error comprises a determination of a calibration error, a maintenance error, or a technician error.

In some embodiments, the determination of whether there is an error comprises a determination of a calibration error, and wherein the processor is further configured to generate a one or more recalibration settings and to transmit the recalibration settings, via electronic communication, to a user device.

In some embodiments, the determination of whether there is an error comprises a determination of a maintenance error, and wherein the processor is further configured to generate a work order associated with the error and to transmit the work order, via electronic communication, to a user device.

In some embodiments, the determination of whether there is an error comprises a determination of a technician error, and wherein the processor is further configured to generate a training order associated with the error and to transmit the training order, via electronic communication, to a user device.

In accordance with some embodiments of the present disclosure, an example method for determining an error from testing of RF modules is provided. The method comprising receiving, via a network, a plurality of test data objects, wherein each test data object is comprised of test result data generated by one of a plurality of RF module test stations, and wherein each test data object is associated with one of the RF modules and one RF module test station of the plurality of RF module test stations; generating, based on each test data object, a determination of whether there is an error associated with a test of one or more of the RF modules; and generating, upon a determination that there is an error, an indication of a source of error.

In some embodiments, the determination of whether there is an error is based on one or more trends based on the test result data of each test data object of the plurality of test data objects.

In some embodiments, the method further comprises: generating a visualization of the source of error based on the test data object associated with the source of error and the plurality of test data objects not associated with the source of error; and transmitting, via an electronic communication, an alert comprising the visualization to a user device.

In some embodiments, the determination of whether there is an error comprises a determination of a calibration error, a maintenance error, or a technician error.

In some embodiments, the determination of whether there is an error comprises a determination of a calibration error, and the method further comprises: generating one or more recalibration settings; and transmitting the recalibration settings, via electronic communication, to a user device.

In accordance with some embodiments of the present disclosure, an example method for determining an error from testing of RF modules is provided. The method comprises: testing, at one or more test stations, a plurality of RF modules; generating, by the one or more test stations for each tested RF module, at least one test data object, wherein each test data object comprises test results associated with the tested RF module, and wherein each test result comprises at least a first test parameter; receiving, via a network, the at least one test data object; determining whether each test data object of the at least one test data objects is associated with one of the one or more test stations indicate an error; generate, upon a determination of an error, an alert; and transmit the alert to a user device.

In some embodiments, the error is a calibration error.

In some embodiments, determining whether each test data object of the at least one test data objects is associated with one of the one or more test stations indicate the calibration error is based on the at least one test data objects, an average first test parameter, and a first test parameter threshold.

In some embodiments, the method further comprises: dynamically updating the average first test parameter in response receiving to additional test data objects; and redetermining, as a result of the dynamically updating of the average first test parameter, whether at least one of the test data objects associated indicate a calibration error.

In some embodiments, the error is a maintenance error.

In some embodiments, determining whether each test data object of the at least one test data objects is associated with one of the one or more test stations indicate the maintenance error is based on the at least one test data objects and a test result associated with a failure of a portion of a test station.

In some embodiments, the error is a technician error.

In some embodiments, determining whether each test data object of the at least one test data objects is associated with one of the one or more test stations indicate the technician error is based on the test data results of test data objects associated with a first technician and a first range associated with test data results of test data objects not associated with the first technician.

In accordance with some embodiments of the present invention, an example method for revising a simulated RF module based on test results is provided. The method comprising: receiving a model of a RF module; simulating a simulation of the model of the RF module; determining, from the simulation of the model of the RF module, a first simulated output for the model of the RF module; testing, at one or more test stations, a plurality of RF modules; generating, at one or more test stations, test result data for each test of the plurality of RF modules; receiving, from the one or more test stations, the test result data; determining a variation based on the first simulated output and the test result data; and revising, upon a determination that the variation is greater than a first threshold, the model of the RF module.

In some embodiments, revising the model of the RF module comprises updating a value associated with a first component of the module of the RF module.

In some embodiments, receiving the test result data is in response to a query to each of the one or more test stations with a request for test result data associated with the model of the RF module.

In some embodiments, the model of the RF module is associated with an identification code and the plurality of RF modules are each associated with the identification code.

In some embodiments, the test result data comprises one or more tuning actions data associated with tuning of one or more of the plurality of RF modules.

In some embodiments, the test result data comprises pre-tune test result data associated with test result data generated before one or more tuning actions and post-tune test associated with test result data generated after one or more tuning actions.

In some embodiments, receiving the test result data comprises receiving test result data from one or more test stations in real-time one a test of one of the plurality of RF modules is completed.

In accordance with some embodiments of the present disclosure, an example computer program product for revising a simulated RF module based on test results is provided. The computer program product comprising computer-readable program instructions stored on a non-transitory computer readable medium, the computer-readable program instructions configured, upon execution by a processor, to: receive a model of a RF module; simulate a simulation of the model of the RF module; determine, from the simulation of the model of the RF module, a first simulated output for the model of the RF module; receive a plurality of test result data generated at one or more test stations based on tests of a plurality of RF modules; determine a variation based on the first simulated output and the plurality of test result data; and revise, upon a determination that the variation is greater than a first threshold, the model of the RF module.

In some embodiments, revising the model of the RF module comprises updating a value associated with a first component of the module of the RF module.

In some embodiments, receiving the plurality of test result data is in response to a query to each of the one or more test stations with a request for test result data associated with the model of the RF module.

In some embodiments, the model of the RF module is associated with an identification code and the plurality of RF modules are each associated with the identification code.

In some embodiments, the test result data comprises one or more tuning actions data associated with tuning of one or more of the plurality of RF modules.

In some embodiments, the test result data comprises pre-tune test result data associated with test result data generated before one or more tuning actions and post-tune test associated with test result data generated after one or more tuning actions.

In some embodiments, receiving the plurality of test result data comprises receiving test result data from one or more test stations in real-time one a test of one of the plurality of RF modules is completed.

In accordance with some embodiments of the present disclosure, an example apparatus is provided. The apparatus comprising at least one processor and at least one memory coupled to the processor, wherein the processor is configured to: receive a model of a RF module; simulate a simulation of the model of the RF module; determine, from the simulation of the model of the RF module, a first simulated output for the model of the RF module; receive a plurality of test result data generated at one or more test stations based on tests of a plurality of RF modules; determine a variation based on the first simulated output and the plurality of test result data; and revise, upon a determination that the variation is greater than a first threshold, the model of the RF module.

In some embodiments, to revise the model of the RF module comprises an update to a value associated with a first component of the module of the RF module.

In some embodiments, to receive the plurality of test result data is in response to a query to each of the one or more test stations with a request for test result data associated with the model of the RF module.

In some embodiments, the model of the RF module is associated with an identification code and the plurality of RF modules are each associated with the identification code.

In some embodiments, the plurality of test result data comprises one or more tuning actions data associated with tuning of one or more of the plurality of RF modules.

In some embodiments, the plurality of test result data comprises pre-tune test result data associated with test result data generated before one or more tuning actions and post-tune test associated with test result data generated after one or more tuning actions.

In accordance with some embodiments of the present invention, an example method for determining a combination of RF modules for an RF assembly is provided. The method comprising: testing, at one or more test stations, a first plurality of first RF modules; generating, by the one or more test stations and based on the testing of the first plurality of first RF modules, a plurality of first test result data; testing, at the one or more test stations, a second plurality of second RF modules; generating, by the one or more test stations and based on the testing of the second plurality of second RF modules, a plurality of second test result data; receiving criteria data for a combination of first RF module and second RF module for a first RF assembly; and determining a first plurality of combinations of the first RF modules and the second RF modules for a first plurality of RF assemblies based on the criteria data, plurality of first test result data, and plurality of second test result data.

In some embodiments, determining a first plurality of combinations of the first RF modules and the second RF modules comprises simulating the first plurality of combinations of the first RF modules and the second RF modules as RF assemblies.

In some embodiments, the method further comprising: determining whether the first plurality of combinations of the first RF modules and the second RF modules may be optimized based on the criteria data, the plurality of first test result data, and the plurality of second test result data; and determining, based on a determination the first plurality of combinations may be optimized, a second plurality of combinations of the first RF modules and the second RF modules based on the criteria data, the plurality of first test result data, and the plurality of second test result data.

In some embodiments, determining whether the first plurality of combinations of the first RF modules and the second RF modules may be optimized comprises simulating the first plurality of combinations of the first RF modules and the second RF modules as RF assemblies.

In some embodiments, method further comprising: generating a visualization including an indication of the first plurality of combinations of the first RF modules and the second RF modules for the first plurality of RF assemblies; and transmitting, for display, the visualization in an electronic communication to a user device.

In some embodiments, determining a first plurality of combinations of the first RF modules and the second RF modules based on the criteria data, plurality of first test result data, and plurality of second test result data comprises applying a weighting of the criteria data to prioritize the criteria data.

In some embodiments, the method further comprising: determining, prior to determining the first plurality of combinations of the first RF modules and the second RF modules for the first plurality of RF assemblies, whether each of the plurality of first test result data are acceptable and each of the plurality of second test result data are acceptable; and wherein determining the first plurality of combinations of the first RF modules and the second RF modules for the first plurality of RF assemblies based on the plurality of first test result data and the plurality of second test result data excludes each of the first plurality of first RF modules and each of the second plurality of second RF modules associated with test result data that is not acceptable.

In accordance with some embodiments of the present disclosure, an example computer program product is provided. The computer program product comprising computer-readable program instructions stored on a non-transitory computer readable medium, the computer-readable program instructions configured, upon execution by a processor, to: test, at one or more test stations, a first plurality of first RF modules; generate, by the one or more test stations and based on the testing of the first plurality of first RF modules, a plurality of first test result data; test, at the one or more test stations, a second plurality of second RF modules; generate, by the one or more test stations and based on the testing of the second plurality of second RF modules, a plurality of second test result data; receive criteria data for a combination of first RF module and second RF module for a first RF assembly; and determine a first plurality of combinations of the first RF modules and the second RF modules for a first plurality of RF assemblies based on the criteria data, plurality of first test result data, and plurality of second test result data.

In some embodiments, to determine a first plurality of combinations of the first RF modules and the second RF modules comprises a simulation of the first plurality of combinations of the first RF modules and the second RF modules as RF assemblies.

In some embodiments, the computer-readable program instructions are further configured, upon execution, to: determine whether the first plurality of combinations of the first RF modules and the second RF modules may be optimized based on the criteria data, plurality of first test result data, and plurality of second test result data; and determine, based on a determination the first plurality of combinations may be optimized, a second plurality of combinations of the first RF modules and the second RF modules based on the criteria data, plurality of first test result data, and plurality of second test result data.

In some embodiments, determining whether the first plurality of combinations of the first RF modules and the second RF modules may be optimized comprises a simulation of the first plurality of combinations of the first RF modules and the second RF modules as RF assemblies.

In some embodiments, the computer-readable program instructions are further configured, upon execution, to: generate a visualization including an indication of the first plurality of combinations of the first RF modules and the second RF modules for the first plurality of RF assemblies; and transmit, for display, the visualization in an electronic communication to a user device.

In some embodiments, to determine a first plurality of combinations of the first RF modules and the second RF modules based on the criteria data, plurality of first test result data, and plurality of second test result data comprises an application of a weighting of the criteria data to prioritize the criteria data.

In some embodiments, the computer-readable program instructions are further configured, upon execution, to: determine, prior to determining a first plurality of combinations of the first RF modules and the second RF modules for a first plurality of RF assemblies, whether each of the plurality of first test result data are acceptable and each of the plurality of second test result data is acceptable; and wherein to determine a first plurality of combinations of the first RF modules and the second RF modules for a first plurality of RF assemblies based on the plurality of first test result data and the plurality of second test result data excludes each of the first plurality of RF modules and each of the second plurality of RF modules associated with test result data that is not acceptable.

In accordance with some embodiments of the present disclosure, an example apparatus is provided. The apparatus comprising at least one processor and at least one memory coupled to the processor, wherein the processor is configured to: receive a plurality of first test result data generated at one or more test stations based on tests of a plurality of first RF modules; receive a plurality of second test result data generated at one or more test stations based on tests of a plurality of second RF modules; receive criteria data for a combination of first RF module and second RF module for a first RF assembly; and determine a first plurality of combinations of the first RF modules and the second RF modules for a first plurality of RF assemblies based on the criteria data, plurality of first test result data, and plurality of second test result data.

In some embodiments, to determine a first plurality of combinations of the first RF modules and the second RF modules comprises a simulation of the first plurality of combinations of the first RF modules and the second RF modules as RF assemblies.

In some embodiments, the processor is further configured to: determine whether the first plurality of combinations of the first RF modules and the second RF modules may be optimized based on the criteria data, plurality of first test result data, and plurality of second test result data; and determine, based on a determination the first plurality of combinations may be optimized, a second plurality of combinations of the first RF modules and the second RF modules based on the criteria data, plurality of first test result data, and plurality of second test result data.

In some embodiments, to determine whether the first plurality of combinations of the first RF modules and the second RF modules may be optimized comprises a simulation of the first plurality of combinations of the first RF modules and the second RF modules as RF assemblies.

In some embodiments, the processor is further configured to: generate a visualization including an indication of the first plurality of combinations of the first RF modules and the second RF modules for the first plurality of RF assemblies; and transmit, for display, the visualization in an electronic communication to a user device.

In some embodiments, to determine a first plurality of combinations of the first RF modules and the second RF modules based on the criteria data, plurality of first test result data, and plurality of second test result data comprises an application of a weighting of the criteria data to prioritize the criteria data.

BRIEF DESCRIPTION OF THE DRAWINGS

Having described various embodiments of the disclosure in general terms, reference is now made to the accompanying drawings, which are not necessarily drawn to scale.

DETAILED DESCRIPTION

Figure 1:
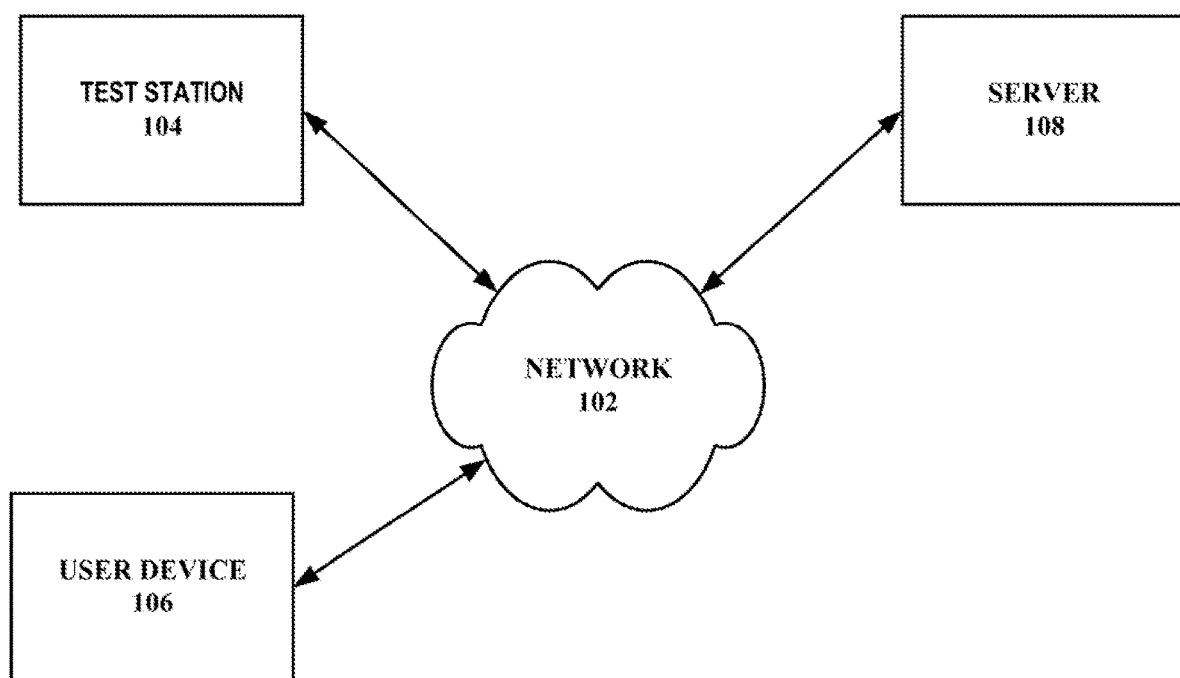
FIG. 1 illustrates an exemplary overview of a system that can be used to practice embodiments of the present invention.

Embodiments of the present disclosure will be described more fully with reference to the accompanying drawings, in which some, but not all, embodiments of the disclosure are illustrated. Indeed, embodiments of the disclosure may be embodied in many different forms and should not be construed as limited to the embodiments set forth herein; rather, these embodiments are provided so that this disclosure will satisfy applicable legal requirements. The term "or" (also denoted "/") is used herein in both the alternative and conjunctive sense, unless otherwise indicated. The terms "illustrative" and "exemplary" are used to be examples with no indication of quality level. The terms "generally," "substantially," and "approximately" refer to within engineering and/or manufacturing tolerances and/or within user measurement capabilities, unless otherwise indicated. Like reference numbers in the drawings refer to like elements throughout.

Many modifications and other embodiments of the disclosure set forth herein will come to mind to one skilled in the art to which this disclosure pertains after having the benefit of the teachings presented in the foregoing description and the associated drawings. Therefore, it is to be understood that the embodiments are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims.

Definitions

Although specific terms are employed herein, they are used in a generic and descriptive sense only and not for purposes of limitation.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

As used herein, the phrases "in one embodiment," "according to one embodiment," "in some embodiments," "in various embodiments," and the like generally refer to the fact that the particular feature, structure, or characteristic following the phrase may be included in at least one embodiment of the present disclosure but not all embodiments of the present disclosure. Thus, the particular feature, structure, or characteristic may be included in more than one embodiment of the present disclosure such that these phrases do not necessarily refer to the same embodiment.

As used herein, the word "example" is used herein to mean "serving as an example, instance, or illustration." Any implementation described herein as "example" is not necessarily to be construed as preferred or advantageous over other implementations.

As used herein, the term "computer-readable medium" refers to non-transitory storage hardware, non-transitory storage device or non-transitory computer system memory that may be accessed by a controller, a microcontroller, a computational system, or a module of a computational system to encode thereon computer-executable instructions or software programs. A non-transitory "computer-readable medium" may be accessed by a computational system or a module of a computational system to retrieve and/or execute the computer-executable instructions or software programs encoded on the medium. Exemplary non-transitory computer-readable media may include, but are not limited to, one or more types of hardware memory, non-transitory tangible media (for example, one or more magnetic storage disks, one or more optical disks, one or more USB flash drives), computer system memory or random access memory (such as, DRAM, SRAM, EDO RAM), and the like.

As used herein, the terms "data," "content," "information," "electronic information," "signal," "command," and similar terms may be used interchangeably to refer to data capable of being transmitted, received, and/or stored in accordance with embodiments of the present disclosure. Thus, use of any such terms should not be taken to limit the spirit or scope of embodiments of the present disclosure. Further, where a first computing device is described herein to receive data from a second computing device, it will be appreciated that the data may be received directly from the second computing device or may be received indirectly via one or more intermediary computing devices, such as, for example, one or more servers, relays, routers, network access points, base stations, hosts, and/or the like, sometimes referred to herein as a "network." Similarly, where a first computing device is described herein as sending data to a second computing device, it will be appreciated that the data may be sent directly to the second computing device or may be sent indirectly via one or more intermediary computing devices, such as, for example, one or more servers, remote servers, cloud-based servers (e.g., cloud utilities), relays, routers, network access points, base stations, hosts, and/or the like.

As used herein, the term "data object" and/or the like refer to a structured arrangement of data and/or electronically-managed data that is generated and/or maintained by a computing device (e.g., apparatus, computing device, or system or server of the present disclosure) and may be a collection of datum associated with the computing device. In various embodiments, data objects may contain data in one or more different formats, which may depend on the data and/or how the data was created. In various embodiments, a data object may be encrypted or access to a data object may otherwise be limited. A test data object may contain test result data.

In various embodiments, expected result for a test generated by a simulation and the expected results may be stored in an expected results test data object.

As used herein, the terms "user device," "mobile device," and the like refer to computer hardware that is configured (either physically or by the execution of software) to communicate with one or more systems, devices, and/or servers, and is configured to directly, or indirectly, transmit and receive data. Example user devices may include a smartphone, a tablet computer, a desktop computer, a laptop computer, a wearable device (e.g., smart glasses, smart watch, or the like), and the like. Embodiments of user devices may be further described herein.

As used herein, the term "circuitry" refers to hardware and also may include software for configuring the hardware. For example, although "circuitry" may include processing circuitry, storage media, network interfaces, input/output devices, and the like, other elements may provide or supplement the functionality of particular circuitry.

Having set forth a series of definitions called-upon throughout this application, an example system architecture and example apparatus are described below for implementing example embodiments and features of the present disclosure.

Overview

An RF module, sometimes referred to as a module, is a specifically designed circuit or collection of circuits that provide one or more specific transfer functions while meeting stringent requirements for the environment in which the RF module will be utilized in. In an exemplary embodiment, an RF module may be used in commercial or aerospace systems and, thus, may be subjected to widely varying environments. RF modules may be subjected to large amounts of temperature fluctuations, large amounts of electrical noise, large physical system shocks and stresses, and other variations in environments. An RF module may have multiple input and output ports that each connect to other systems, subsystems, or RF modules associated with the application and may receive variations coming from those connections. Thus it is critical that RF modules be designed and manufactured to stringent test requirements as well as tested to ensure that those requirements are met.

As noted above, systems, apparatuses, and methods are described herein for testing, analyzing, and assembling RF modules. Specific examples of RF modules include conditioning RF modules, distribution RF modules, and converter RF modules. Conditioning RF modules may condition one or more signals conducted through the RF module. Distribution RF modules may distribute one or more signals conducted through the RF module to two or more output ports. Converter RF modules may convert an input signal into another signal that may then be distributed to one or more output ports.

The testing of RF modules generates test results that may be analyzed and used to improve the design, manufacturing, and testing of RF modules and RF assemblies, which may be a combination of two or more RF modules. The test process, however, may include one or more errors, which may be due to test station calibration and/or maintenance or technician error in operating a test station. Test results from testing, both with and without errors, may be used to generate visualizations of the design, manufacturing, and testing processes and to improve the design, manufacturing, and testing processes.

In addressing errors, prior systems and processes have relied on what is referred to as a gold unit. A golden unit is a manufactured and tested RF module that has been validated to be within specification. When an error arises during testing, a golden unit may used in further testing, which may involve multiple tests, to assist in determining a source of error. For example, if a test generated test results including an error, the source of that error may be due to manufacturing creating a test error in the RF module under test or it may be from a technician's ability to execute the test(s), a calibration of a test station, or a test station needing maintenance. Repeating the test(s) that led to the error on the golden unit may or may not lead to identification of the source of error. This is a time consuming process in rerunning the test(s), which may also require repeating a test multiple times with one or more additional technicians. Retesting with a golden unit also provides limited insight into errors, including only identifying errors after they have occurred.

Embodiments described herein improve the identification of errors, including identifying where and potential when errors may be likely to occur and how to remedy the errors, either with the RF module(s), the test station, or the technician. Improvements include, among other things, lowering the time to identify and address errors during testing, identifying when and where a test station may need to be calibrated or maintained, identifying which technicians may need further training, particularly what training, in executing a test, visualizing test results generating during testing, improving overall test time for testing an RF module, and improving the fidelity of designs with revisions during the design and simulation of modules RF modules and/or RF assemblies. Additional improvements are described below.

Example Systems and Apparatuses

FIG. 1 illustrates an exemplary overview of a system that can be used to practice embodiments of the present invention. As illustrated in FIG. 1, at least one test station 104 is communicatively coupled with at least one user device 106 and at least one server 108 via a network 102. In various embodiments, the test station 104 may be configured as a stand-alone system. In various embodiments the test station 104 may have a user device 106 or a server 108 integrated. It will also be appreciated that while FIG. 1 illustrates one test station 104, the system may include more than one test station 104. Test station 104, user device 106, and server 108 may, as further described herein, transmit or receive one or more types of data, such as in one or more data objects.

User device 106 is communicatively coupled to the test station 104 via network 102 and is capable of communications with the test station 104. In various embodiments, communication by the user device 106 over the network 102 may be via one or more applications installed on the user device 106 or test station 104.

In various embodiments, an application may be configured to run on a user device 106 and may display data and/or data objects related to test station 104. The application may also communicate with the server 106, including to browse data and/or data objects stored on server 106, including but not limited to test results, which may be generated by one or more test stations 104. In various embodiments, the application may be configured to display data received from or by the test station 104. In various embodiments, a user of a user device 106 may query data from a test station 104 and/or server 108, such as for use in various applications. An application may allow for data visualization(s) and/or creating and executing simulations, such as simulating the performance of one or more RF modules and/or RF assemblies.

Server 108 may be configured to store data, such as in data objects, which may include test results and other data described herein. In various embodiments, communication with test station 104 or user device 106 be via suitable applications. In various embodiments, suitable applications may include or be configured for encryption, format conversion, and/or timing settings (e.g., real-time, batch, scheduled, and/or triggered) associated with providing and/or receiving data and/or data objects. In one embodiment, the server 108 may be configured to receive or provide data or data objects by means of secured application(s), which may use one or more types of encryption and or user authentication. In various embodiment, server 108 may include one or more processors to execute simulations, aggregate test result data, analyze test result data, and/or generate visualizations.

Figure 2:
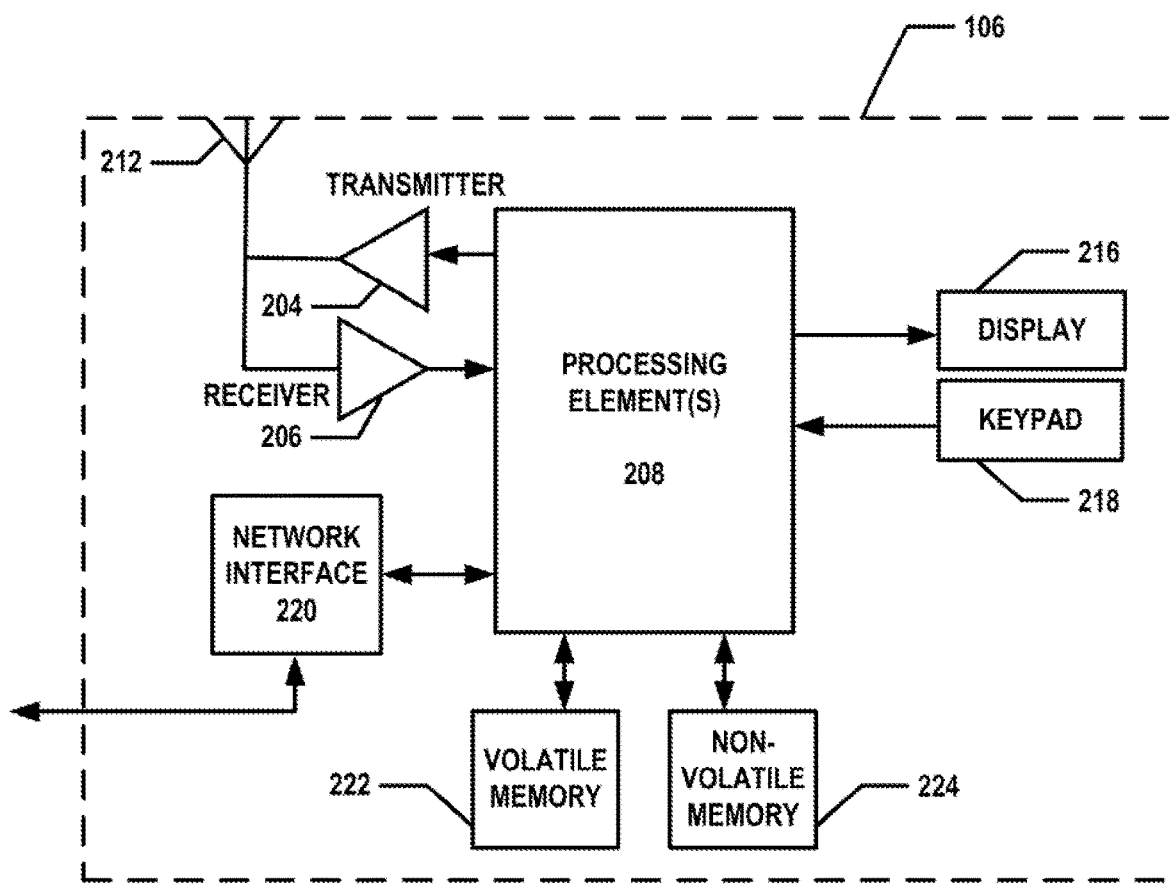
FIG. 2 illustrates an exemplary user device in accordance with some embodiments discussed herein.

FIG. 2 provides an exemplary user device 106 in accordance with some embodiments discussed herein. In various embodiments, a user device 106 is a computer configured to allow a user to provide input and receive, display, analyze, and/or the like output from a test station 104, such as test results that may be received in a test data object. In various embodiments, a user may use user device 106 to provide input to the test station 104, including a user providing input that results in a process on the test station 104 to be executed.

As shown in FIG. 2, a user device 106 can include an antenna 212, a transmitter 204 (e.g., radio, WiFi, etc.), a receiver 206 (e.g., radio, WiFi, etc.), and a processing element 208 that provides signals to and receives signals from the transmitter 204 and receiver 206, respectively. The signals provided to and received from the transmitter 204 and the receiver 206, respectively, may include signaling information/data in accordance with an air interface standard of applicable wireless systems to communicate with various entities, such as a test station 104, other user devices 106, server 108, and/or the like. The user device 106 can include a network interface 220, which may provide signals to and receive signals in accordance with an interface standard of applicable network systems to communicate with various entities, such as a test station 104, other user devices 106, server 108, and/or the like.

In this regard, the user device 106 may be capable of operating with one or more air interface standards, communication protocols, modulation types, and access types. For example, the user device 106 may be configured to receive and/or provide communications using a wired data transmission protocol (e.g., PCIE, Ethernet, RS422, DSL, etc.). Similarly, the user device 106 may be configured to communicate via wireless external communication networks using any of a variety of protocols (e.g., UMTS, GSM, LTE, Wi-Fi, NFC, Bluetooth, etc.). The user device 106 may use such protocols and standards to communicate (e.g., DNS, FTP, HTTP, HTML, IP, TCP, etc.). The user device 106 may also download changes, add-ons, and updates, for instance, to its firmware, software (e.g., including executable instructions, applications, program modules), and operating system.

The user device 106 may also comprise a user interface device comprising one or more user input/output interfaces (e.g., a display 216 and/or speaker/speaker driver coupled to a processing element 208 and a touch screen, keyboard, mouse, and/or microphone coupled to a processing element 208). For instance, the user output interface may be configured to provide an application, browser, user interface, interface, dashboard, screen, webpage, page, and/or similar words used herein interchangeably executing on and/or accessible via the user device 106 to cause display or audible presentation of information/data and for interaction therewith via one or more user input interfaces. The user input interface can comprise any of a number of devices allowing the user device 106 to receive data, such as a keypad 218 (hard or soft), a touch display, voice/speech or motion interfaces, scanners, readers, or other input device. In embodiments including a keypad 218, the keypad 218 can include (or cause display of) the conventional numeric (0-9) and related keys (#, *), and other keys used for operating the user device 106 and may include a full set of alphabetic keys or set of keys that may be activated to provide a full set of alphanumeric keys. In addition to providing input, the user input interface can be used, for example, to activate or deactivate certain functions, such as screen savers and/or sleep modes. Through such inputs the user device 106 can collect information/data, user interaction/input, and/or the like.

The user device 106 can also include volatile storage or memory 222 and/or non-volatile storage or memory 224, which can be embedded and/or may be removable. For instance, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database management system entities, data, applications, programs, program modules, scripts, source code, object code, byte code, compiled code, interpreted code, machine code, executable instructions, and/or the like to implement the functions of the user device 106.

Figure 3:
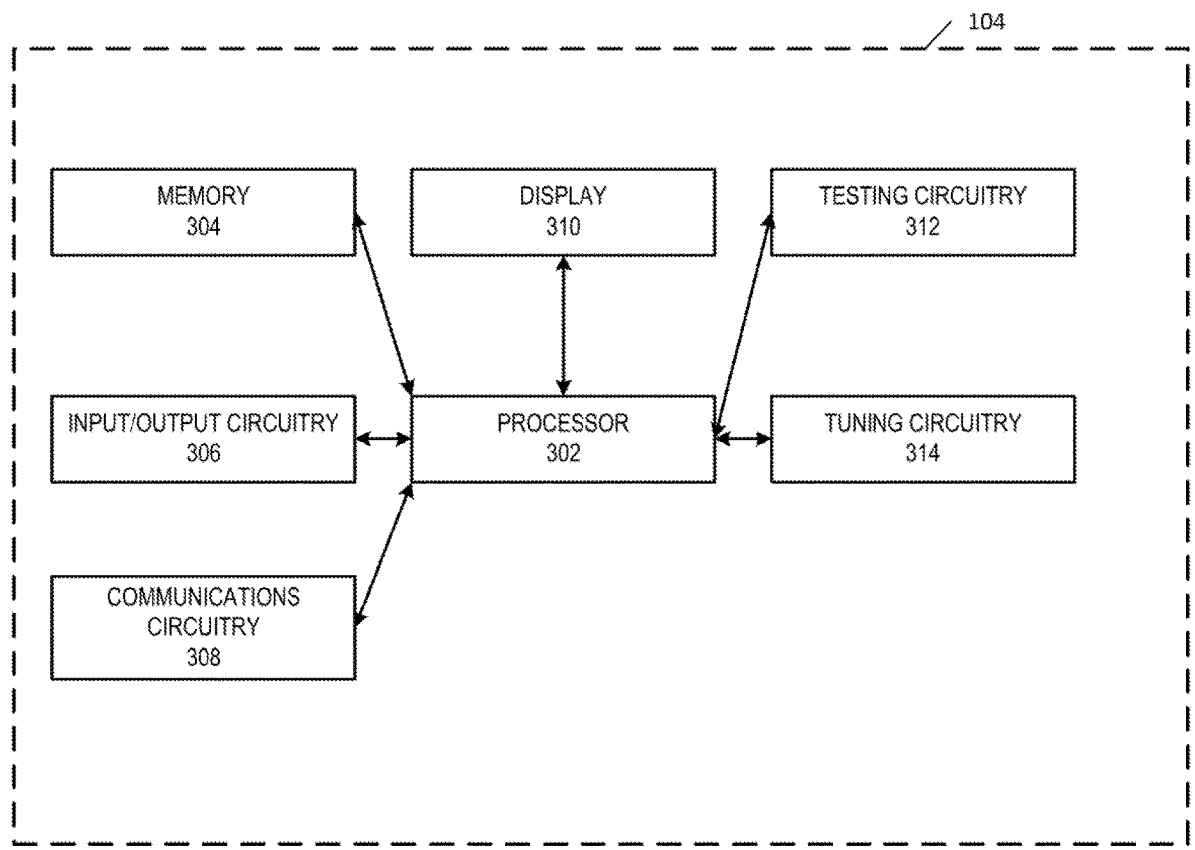
FIG. 3 illustrates an exemplary test station in accordance with some embodiments discussed herein.

FIG. 3 provides an illustration of an exemplary test station 300 in accordance with various embodiments discussed herein. The exemplary test station 300 is an exemplary embodiment of test station 104. Multiple types of test stations are contemplated, including test stations that perform different mechanical tests, different chemical tests, and different electrical tests to test for a plurality of parameters. Alternatively, one or more of such different tests may be performed by a single test station equipment with the proper equipment to carry out the different tests. Additionally or alternatively, a test station may test an RF module before manufacturing is completed, such as after a particular manufacturing step or process is complete, or test a completed RF module. Additionally or alternatively, a test station may test an RF assembly.

The test station 300 may be embodied by one or more computing systems or devices, such as shown in FIG. 2 (e.g., an exemplary apparatus of the present disclosure). While FIG. 3 provides an exemplary test station 300, it will be appreciated modifications may be made to the illustrated embodiment, such as with certain illustrated circuitry not being present in every embodiment described herein or additional circuitry being present.

In various embodiments, the test station 300 may include processor 302, memory 304, input/output circuitry 306, communications circuitry 308, display 310, testing circuitry 312, and/or tuning circuitry 316. The test station 300 may be configured to execute the operations described herein. Although these components 302-316 are described with respect to functional limitations, it should be understood that the particular implementations necessarily include the use of particular hardware. It should also be understood that certain of these components 302-316 may include similar or common hardware or may be specialized hardware. For example, two sets of circuitries may both leverage use of the same processor, network interface, storage medium, or the like to perform their associated functions, such that duplicate hardware is not required for each set of circuitries. It should also be understood that while FIG. 3 illustrates connectors between components 304-316 and processor 302, the components may be directly connected to each other.

The processor 302 may be embodied in a number of different ways and may, for example, include one or more processing devices configured to perform independently. In some embodiments, the processor 302 may include one or more processors configured in tandem via a bus to enable independent execution of instructions, pipelining, and/or multithreading. In various embodiments, the processor 302 may include a single core processor, a multi-core processor, multiple processors internal to the apparatus, and/or remote or "cloud" processors.

In various embodiments, the processor 302 may be configured to execute instructions stored in the memory 304 or otherwise accessible to the processor 302. In various embodiments, the processor 302 may be configured to execute hard-coded functionalities. As such, whether configured by hardware or software methods, or by a combination thereof, the processor 302 may represent an entity (e.g., physically embodied in circuitry) capable of performing operations according to an embodiment of the present disclosure while configured accordingly. Alternatively, as another example, when the processor 302 is embodied as an executor of software instructions, the instructions may specifically configure the processor 302 to perform the algorithms and/or operations described herein when the instructions are executed.

In various embodiments, the processor 302 (and/or coprocessor or any other processing circuitry assisting or otherwise associated with the processor) may be in communication with the memory 304 via a bus for passing information among components of the system or apparatus. The memory 304 is non-transitory and may include, for example, one or more volatile and/or non-volatile memories. In other words, for example, the memory 304 may be an electronic storage device (e.g., a computer-readable storage medium). The memory 304 may be configured to store data objects, data, content, applications, instructions, or the like for enabling the system or apparatus to carry out various functions in accordance with embodiments of the present disclosure.

In various embodiments, the test station 300 may include input/output circuitry 306 that may, in turn, be in communication with processor 302 to provide output to a user and to receive an indication of a user's input. The input/output circuitry 306 may comprise a user interface (e.g., one or more input devices), a web user interface, a mobile application, a query-initiating computing device, a kiosk, or the like. In various embodiments, the input/output circuitry 306 may include a keyboard, a mouse, a joystick, a touch screen, touch areas, soft keys, a microphone, a speaker, or other input/output mechanisms. The processor 302 and/or user interface of the input/output circuitry 306 may be configured to control one or more functions of one or more user interface elements through computer program instructions (e.g., software and/or firmware) stored on a memory accessible to the processor (e.g., memory 304, and/or the like).

The communications circuitry 308 may be any means such as a system, device, and/or circuitry embodied in either hardware or a combination of hardware and software that is configured to receive and/or transmit data from/to a network and/or any other device, circuitry, or module in communication with the test station 300. In this regard, the communications circuitry 308 may include, for example, a network interface for enabling communications with a wired or wireless communication network. For example, the communications circuitry 308 may include one or more network interface cards, antennae, buses, switches, routers, modems, and supporting hardware and/or software, or any other device suitable for enabling communications via a network. Additionally or alternatively, the communications circuitry 308 may include circuitry for interacting with the antenna/antennae to cause transmission of signals via the antenna/antennae or to handle receipt of signals received via the antenna/antennae. These signals may be transmitted by the test station 300 using any of a number of wireless personal area network (PAN) technologies, such as Bluetooth® v1.0 through v3.0, Bluetooth Low Energy (BLE), infrared wireless (e.g., IrDA), ultra-wideband (UWB), induction wireless transmission, or the like. In addition, it should be understood that these signals may be transmitted using Wi-Fi, Near Field Communications (NFC), Worldwide Interoperability for Microwave Access (WiMAX) or other proximity-based communications protocols.

In various embodiments, the test station 30 may include one or more display 310, which may also include speakers, buzzers, alarms, etc. In various embodiments, the display 310 may be part of a user interface that is a part of the input/output circuitry 306. In various embodiments, the display 310 may be configured to provide an application, browser, user interface, interface, dashboard, screen, webpage, and/or page to cause display or presentation of information/data and for interaction therewith via input/output circuitry 306, such as via one or more user input interfaces. In various embodiments, the one or more displays may be touch screens that allow for receiving inputs in addition to displaying output, such as status of tests and/or test results.

The testing circuitry 312 may comprise hardware components configured for performing tests and generating test data, which may be included in test result data in a test result data object. The testing circuitry 312 may comprise one or more pieces of test equipment, such as oscilloscopes, analyzers, cameras, meters, signal generators, power sources, etc. The testing circuitry 312 may also include any connectors, plugs, probes, etc. for connecting the test station to a device being tested, such as a RF module or RF assembly. The testing circuitry may be used by a technician to perform one or more tests on, for example, an RF module, such as testing various electrical parameters (e.g., S parameters) and executing tests (e.g., TDR). Alternatively, testing circuitry may automatically execute one or more tests, such as with automated test equipment and a testing algorithm. In various embodiments a testing algorithm may be programmed by a user in advance of the test and/or received remotely by the test station. A testing algorithm may be output from a simulation and may include acceptable values or ranges of values for test results. The testing circuitry 312 may utilize processing circuitry, such as the processor 302, to perform its corresponding operations and may utilize memory 304 to store data.

The tuning circuitry 314 may comprise hardware components configured to tune a device being tested, such as a RF module. In various embodiments, the tuning circuitry may allow for additive tuning (e.g., daubing), subtractive tuning (e.g., laser ablation), or both additive and subtractive tuning. Tuning circuitry 314 may generate requests to retrieve data by using the communications circuitry 308 to communicate with, for example, input/output circuitry 306, display 310, and/or user devices 106 and/or server 108 via communications circuitry 308. Requests may include requests to technicians or remote users of user device 106 for confirmation to perform a tuning action. The tuning circuitry 314 may utilize processing circuitry, such as the processor 302, to perform its corresponding operations, and may utilize memory 304 to store data. In various embodiments, the tuning circuitry may receive a tuning algorithm from a test station 300 user (e.g., technician), the testing circuitry 312, and/or user device 106 and/or server 108 via communications circuitry 308. In various embodiments, test data and/or test data objects generated by test station 300 may include tuning data, which may be generated all or in part by tuning circuitry 314. In various embodiments, tuning circuitry 314 may be incorporated into or share hardware or software with testing circuitry 312.

In various embodiments, the testing circuitry 312 may make identifications and/or determinations in conjunction with the tuning circuitry 314. In various embodiments, testing circuitry 312 or the tuning circuitry 314 may store the data of what has been identified and/or determined, such as in memory 304. In various embodiments, a testing algorithm may include all or a portion of a tuning algorithm, or a tuning algorithm may include all or a portion of a testing algorithm. In various embodiments, test station 300 may identify an algorithm containing a testing algorithm and a tuning algorithm and identify the portion(s) of the algorithm for testing and the portion(s) for tuning and separate the portions into a respective testing algorithm or tuning algorithm. Similarly, test station 300 may combine a testing algorithm and a tuning algorithm into a new algorithm that includes both portions. Such a combination may include optimization of the algorithm for performance of testing and tuning of, for example, a RF module or RF assembly.

In various embodiments, test station 300 may use testing circuitry 312 and/or tuning circuitry 314 to identify and/or determine attributes of, for example, a RF module or RF assembly being tested. In various embodiments, the identification may include determining attributes, which may include identifying parameters or data associated with size, shape, identification code(s), model(s), etc. The identified parameters may be used to determine the size, shape, identification code(s), model(s), etc. Based on the determined attributes, the testing circuitry 312 and tuning circuitry 314 may determine a testing algorithm and/or a tuning algorithm. In various embodiments the identification may be by machine vision processing an image take from the RF module or RF assembly, which may include, for example, an identification code that identified the RF modules or RF assembly.

It should also be appreciated that, in some embodiments, the testing circuit 312 and/or tuning circuitry 314 may include a separate processor, separate input/output circuitry, separate communications circuitry, separate hardware, and/or separate display, to perform its corresponding functions.

In various embodiments, a test station 300 may include a test bed to place a device under test (e.g., RF module) on during testing. A test bed may be insulated (e.g., thermally insulated, electrically insulated, etc.), leveled, self-leveling, and/or have a suspension (e.g., air suspension), any of which may be used to minimize or eliminate undesired environment elements from being introduced into a test (e.g., shock, raise in temperature, drop in temperature, etc.). Additionally or alternatively, it may include a hood, such as a vapor hood, which may direct or redirect harmful or toxic vapors to safe location or collection point.

Figure 4A:
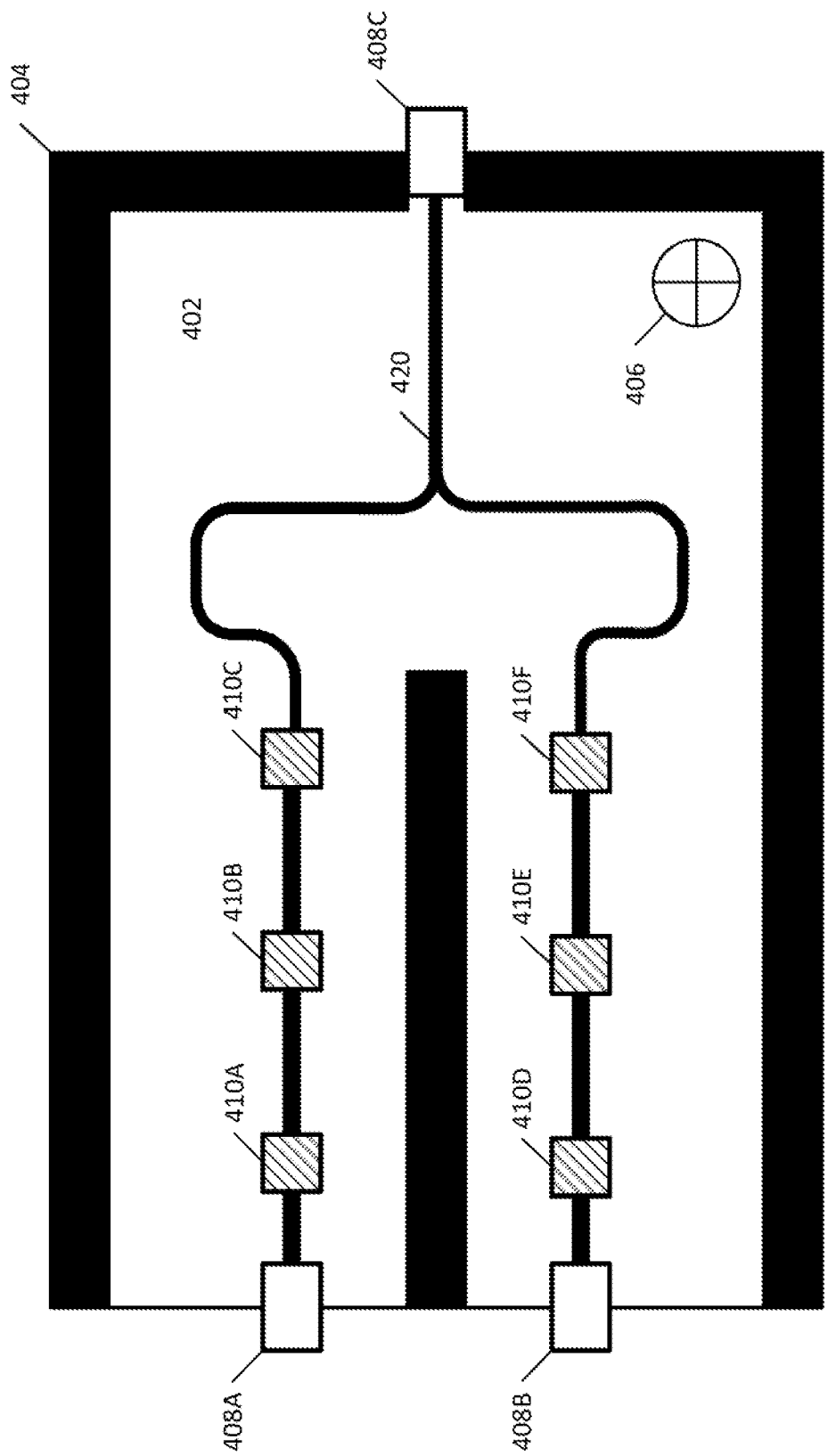
FIG. 4A illustrates an exemplary RF module in accordance with some embodiments discussed herein.

FIG. 4A illustrates an exemplary RF module in accordance with some embodiments discussed herein. A RF module may include a substrate 402, one or more traces 420 deposited or layered on the substrate 402, ports 408 (e.g., input ports 408A, 408B and output port 408C) connected via one or more traces 420, electrical components 410A-F (e.g., monolithic microwave integrated circuit ("MMIC"), resistors, capacitors, filters, etc.), RF module walls 404, fiducial(s) 406, and/or connectors connecting electrical components 410A-F and/or traces 420 (e.g., wire bonds, jumpers, tracers, etc.) (not depicted). One or more RF modules may be connected by ports 408, such as an input port and an output port, to create an RF assembly.

The exemplary RF module 400A is illustrated in FIG. 4A includes substrate 402, RF module walls 404, fiducial 406, two input ports 408A, 408B, one output port 408C, and six electrical components 410A-F.

In various embodiments, substrate 402 may be surrounded by RF module walls 404 such that the substrate 402 is completed surrounded. Alternatively, one or more portions of an RF module may not be completely surrounded by RF module walls 404, which may create one or more openings. In various embodiments, RF module walls 404 may include one or more apertures and/or fasteners that may be used with a lid (not depicted) to cover the RF module, which may also enclose the substrate 402, fiducial 406, electrical components 410A-F. When a lid is attached, input ports and output ports may be the only portions an RF module exposed through the RF module walls or, alternatively, if one or more openings are present, such openings may allow airflow through the RF module. Such airflow may, for example, assist with temperature control, such as cooling and/or the flow of certain gases or liquids through the RF module.

In various embodiments, fiducial 406 may be a visual indicator that is associated with a specific location of the substrate in relation to the remainder of the RF module 400. A fiducial may be used in conjunction with an imaging device, such as a camera and image recognition system, to identify or locate a specific location on the RF module. In various embodiments, a fiducial may be used to measure distances from the fiducial, or part of the fiducial, to another part of the RF module 400. In various embodiments, the fiducial may be or include a specific symbol that contains and/or is associated with additional information, such as a QR code, allowing for the determination of additional information about or uniquely identifying the RF module (e.g., a serial number, a model number, a manufacturing date, etc.).

Ports 408, such as in input ports and output ports, may be a connector (e.g., coaxial connector, pin connector, etc.) for attaching external connections to the RF module 400. Connections may be directly to another RF module 400 or may be used with a connector, such as a cable.

An electrical signal applied to RF module 400A may be input via either input port 408A or 408B and output to output port 408C. The traces 420 may transmit the electrical signals between their connections. In various embodiments, the traces 420 transmit and modify the electrical signals transmitted, which may include modifying electrical signals due to the physical shape and/or size of the traces 420. The wavelength of an RF signal changes with frequency and, thus, the shape and size of a trace may impact an RF signal transmitted via a trace 420 as the frequency of a signal changes. In various embodiments, the shape and/or size of traces 420 may be tuned by additive or subtractive tuning. Additive tuning may include, but is not limited to, adding material to a trace or on to the substrate, such as adding epoxy, which may change the electrical properties of the trace 420 and/or how an electrical signal propagates along a trace 420. In various embodiments, this is correlated with the frequency of the electrical signal applied to the RF module 400A.

In FIG. 4A, the input ports 408A, 408B are connected to the output ports 408C via traces 420 and electrical components 410. The electrical components 410 may be one or more resistor, capacitor, inductor, MMIC, etc. In various embodiments, MMICs may include, but are not limited to, amplifiers, mixers, switches, transistors, etc.

Figure 4B:
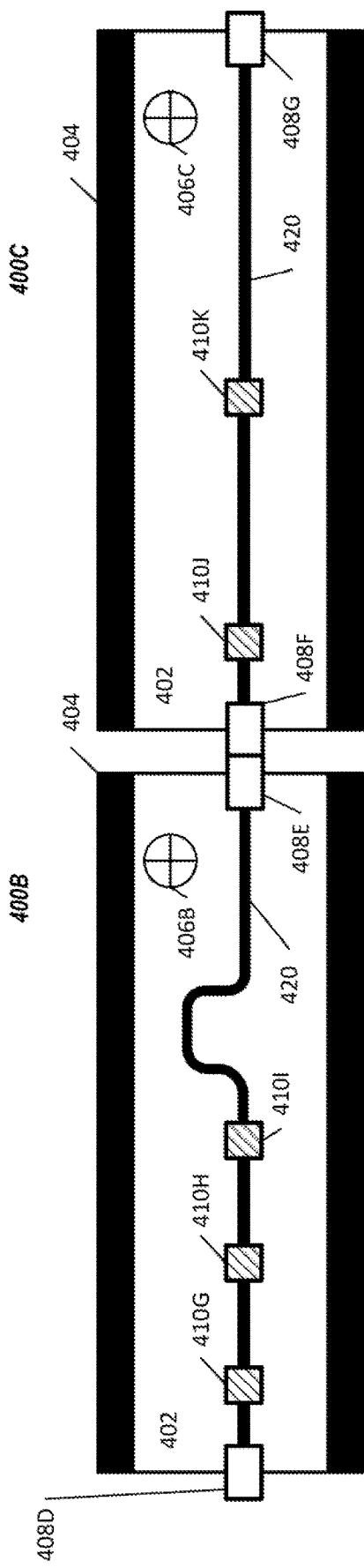
FIG. 4B illustrates an exemplary RF assembly in accordance with some embodiments discussed herein.

FIG. 4B illustrates an exemplary RF assembly in accordance with various embodiments discussed herein. FIG. 4B illustrates RF module 400B combined with RF module 400C to create an RF assembly. RF module 400B's output port 408E is connected to input port 408F of RF module 400C. This connection allows for electrical signals output at output port 408E to be input at input port 408F. Both RF module 400B and RF module 400C include a fiducial 406B, 406C, which may indicate the same (or different) physical location on two modules of the shape and size. A fiducial, as described herein, may also include additional information.

In various embodiments, the impedance of an output port may be match to the impedance of an input port, which allows for minimization of signal reflection and maximization of power transfer. In alternative embodiments, there may be a difference in impedances between an output port and an input port or with connections between the two RF modules.

RF module 400B of FIG. 4B includes three electrical components 410 (i.e., 410G, 410H, 410I) and RF module 400C includes two electrical components 410 (i.e., 410J, 410K). In various embodiments including different types of RF modules, the number of electrical components in different RF modules 400 may be the same or may be different. A different type of RF module may be a different design of an RF module 400, which may allow for a different transfer function. In various embodiments, a different type of RF module (e.g., a second type of RF module) may be a different design than an RF module 400 (e.g., a first type of RF module), but the transfer function may be the same as another type of RF module (e.g., the first type of RF module). Variation in RF module design may be due to availability of materials, differences in manufacturing, differences in specifications for a RF module, etc.

In various embodiments not illustrated, more than two RF modules may be connected as a RF assembly. In various embodiments, a RF assembly may include 3 or more modules, which may, for example, include the three modules connected in parallel or may include two of the modules connected in parallel to the third module. Additionally, the RF modules may be connected directly port-to-port or may be connected by a flexible connector, and such connection may provide for meeting size and shape requirements associated with an assembly, such as when RF modules may be required to be layered.

In various embodiments, the RF modules may each have different transfer functions from an input port to an output port. The connection of two or more RF modules allows for combinations of the different transfer functions to apply the transfer functions to signals transmitted from the input port(s) to the output port(s). In various embodiments, the transfer functions may filter or alter signals to provide, for example, specific signals to be transmitted to or received from an antenna.

While exemplary illustrations of RF modules are illustrated in FIGS. 4A and 4B, other various embodiments include RF modules that have different configurations, such as varying the number of input ports and the number of output ports. In an exemplary embodiment, a RF module may have three of more input ports and may have 2 or more output ports.

As described herein, and as will be appreciated, embodiments of the present disclosure may be configured as systems, apparatuses, methods, and the like. Accordingly, embodiments may comprise various means including entirely of hardware or any combination of software and hardware. Furthermore, embodiments may take the form of a computer program product comprising instructions stored on at least one non-transitory computer-readable storage medium (e.g., computer software stored on a hardware device). Any suitable computer-readable storage medium may be utilized including non-transitory hard disks, CD-ROMs, flash memory, optical storage devices, or magnetic storage devices.

Example Processes

Having described example systems and apparatuses, example processes in accordance with the present disclosure will now be described. It will be appreciated that each of the flowcharts depicts an example process that may be performed by one or more of the systems, apparatuses, devices, and/or computer program products, or combination thereof, described herein.

The blocks depicted in the flowcharts indicate operations. Such operations may be executed in any of a number of ways, including, without limitation, as depicted and described herein. Alternatively, in some embodiments, one or more blocks may occur in another order or may be iterated to repeat the performance of a block. In some embodiments, one or more of the blocks may be optional.

Figure 5:
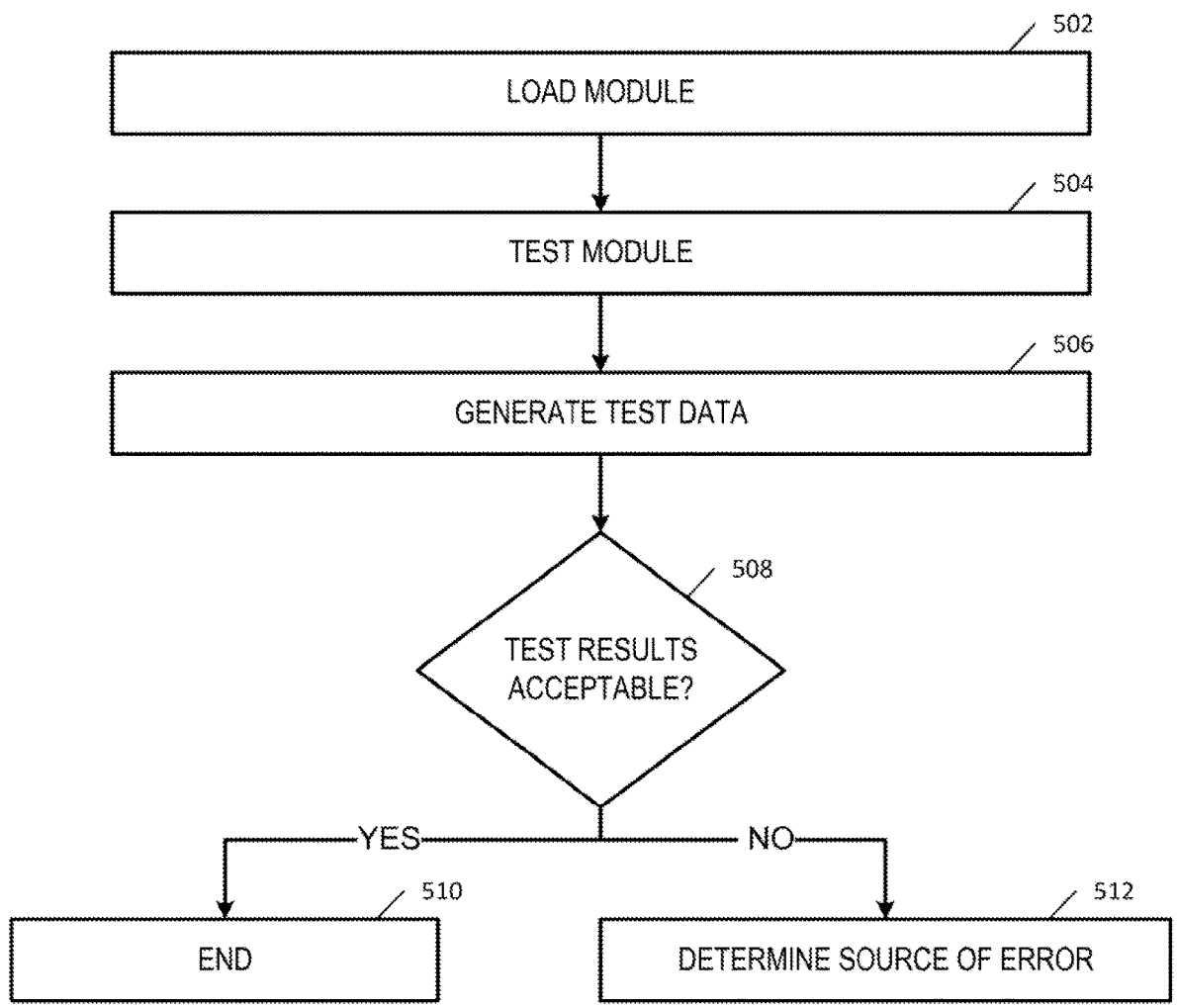
FIG. 5 illustrates a flowchart depicting example operations of a process for testing RF modules in accordance with at least some example embodiments of the present disclosure.

FIG. 5 illustrates a flowchart depicting example operations of a process 500 for testing RF modules in accordance with example embodiments of the present disclosure.

At operation 502 of FIG. 5, an RF module 400 is loaded into a test station. The loading may be performed by a technician, an automated loader, or both a technician and an automated loader. In various embodiments, an automated loader may load an RF module 400, and a technician may adjust the positioning. Loading an RF module 400 may also include connecting one or more parts of the test stations to the RF module, such as the connection of one or more test equipment (e.g., scope) of a test station to the input and/or outputs 408 of the RF module 400 to test for electrical functions and/or parameters. Additionally, the loading of an RF module 400 may include setting or loading parameters, which may be done by a technician inputting information about the data into the test station or by the test station identifying the RF module 400. In various embodiments in which a test station identifies a RF module 400, the identification may be done by identifying an identifier associated with the RF module 400, such as a RF module ID, a sequence ID, a serial number, a part number, etc., which may be a part or module identifier or a unique identifier for that RF module 400. In various embodiments, the identification of the RF module 400 may be done by the test station visually recognizing an RF module 400 or type of RF modules 400, such as with a camera and image recognition, optical capture of an identifier (e.g., bar code, QR code, etc.), reading an RFID, or other means of identification.

At operation 504 of FIG. 5, the RF module 400 is tested with the test station 104. In various embodiments testing an RF module 400 may involve executing one or more types of tests, including executing the same test(s) while varying environmental conditions, such as temperature and/or noise in an environment. Test stations 104 may include equipment to vary environmental conditions as a part of the test equipment, such as heaters, coolers, or HVAC to vary temperature or noise generators to vary noise, which may be included in electrical test equipment.

In various embodiments, the types of tests may include mechanical tests, chemical tests, and/or electrical tests, each of which may test for one or more parameters.

Mechanical tests may include, but are not limited to, measuring of the size, shape, weight, smoothness of surfaces, and/or quality of connections and/or connectors. For example, in various embodiments, mechanical tests may include testing for the size of channels created by the RF module walls 404 and/or width, smoothness of channel walls (e.g., no burrs, etc.), bend radius, smoothness of traces 420. Further examples of mechanical tests include size, shape, and weight of an RF module 400 and/or a RF assembly of a plurality of RF modules (e.g., 404B, 404C).

Chemical tests may include, but are not limited to, measuring the quality of bonds using chemical processes and/or adherence of materials, such as deposits of traces or other materials on substrates.

Electrical tests may include, but are not limited to, measuring S parameters, measuring noise, noise figures, gain sweeps, and/or time domain reflectometry measurements. In various embodiments, S-parameter measurements may be a complex matrix that show reflection and transmission characteristics (e.g., amplitude and phase) in the frequency domain. S-parameter tests may include testing for gain, loss (e.g., insertion loss, input return loss, output return loss), reverse gain, reverse isolation, reflection, impedance (e.g., input impedance, output impedance), admittance, VSWR, etc. In various embodiments, S-parameters may be visualized with Smith charts, rectangular charts, and polar charts. In various embodiments, S-parameters may be converted to time domain parameters, such as with inverse Fast Fourier transform. Electrical tests may be performed at DC or at different frequencies, including performing one or more electrical tests at different ranges of frequencies, which may be referred to as frequency bands or ranges. An electrical test may be performed over different frequency bands or ranges by sequentially moving through the frequency bands or ranges. Alternatively, or additionally, multiple electrical tests may be performed at a first frequency band or range before changing to iterate the electrical tests over one or more subsequent frequency bands or ranges. In various embodiments, the same electrical test(s) may be performed while varying environmental characteristics, such as temperatures or pressures.

Tests performed by a test station may generate test result data, which may be stored as one or more test data objects. In various embodiments, a test data object may comprise test results for an RF module 400 from a plurality of test stations with the test data object being updated with each subsequent generation of test results. Test data objects may also include data providing the conditions in which a test was performed, such as environmental conditions, including those which may be controlled for (e.g., temperature) and those which may not be controlled for (e.g., humidity), which may vary by test station. The test data objects may also include data such as test order that may provide an order in which tests were performed, including if there is a deviation from a prescribed ordering, which may be due to an environmental condition. For example, a prescribed ordering of tests may have a first test conducted at a low temperature (e.g., 100 F) but due to external conditions or previous testing the test station is already at a higher temperature (e.g., 200 F) and a technician chooses to perform a test out of order.

At operation 506 of FIG. 5, test data is generated by test station 104. In various embodiments, test data may include each of the inputs into the test and the outputs of the test along with environmental conditions. Additionally, the test data may include images or video, of the RF module 400 being tested, images of the testing circuitry 312, or both. Images or video may be taken before, during, or after a test is run. In various embodiments, the test data generated will include any tuning actions that may be performed while the RF module 400 is being tested. Additionally, or alternatively, if tuning actions are performed on an RF module 400, a test may be re-run on the RF module 400 such that test data is stored both pre-tune and post-tune. Additionally, metadata may be added to the test data to classify the test results as pre-tune and post-tune.

In various embodiments, the test data generated may be stored in test data objects. The test data or test data objects may be transmitted to user device 106 or server 108 in real-time or it may be transmitted based on a schedule or on a completion of tests. The transmission of real-time data allows for incorporation of data into analysis in real-time and without a delay. The use of batching test data and test data objects allows for transmission when a network may be slower or after sufficient examples have been collected.

In an exemplary embodiment, the test data or test data objects may be stored on a test station 104 until after technicians have left for the day. Then the test data and test data objects may be transmitted to the user device 106 or server 108 when there is less or no competition for network and/or processing resources. As test data and test data objects may be large in size, the network capacity required to transmit the test data and test data objects may be substantial and slow down other portions of the network, particularly if a user device 106 or server 108 is located remotely from the site where the test station 104 is located. In various embodiments, test data or test data objects of a threshold size may be held until a certain time while test data or test data objects under the threshold size may be transmitted in real-time.

At operation 508 of FIG. 5, test data generated is determined to be acceptable or not. In various embodiments, acceptability may be determined based on a threshold or a range associated with the test being performed. A threshold or range associated with one or more of the tests being performed may be derived from assumed statistics, values, or ranges associated with the test, parameter, and/or the RF module 400 being tested. Such assumed statistics, values, or ranges may be from customer requirements, design requirements, simulations of performance of the RF module 400, test results associated with one or more other RF modules 400, and/or test results from a prior test of the same RF module 400. In various embodiments, an acceptable value or range may be determined by a simulation modeling all or part of an RF model 400. The expected test results may be provided to the test station 104 as criteria to be used for determining acceptability. Alternatively, a technician may determine acceptability and/or enter acceptable values or ranges. Yet another alternative, test results may be generated and recorded without determining acceptability by or at the test station.

In various embodiments, the same or similar test may be executed over varying conditions (e.g., temperatures, noise, etc.). It may be advantageous to execute the same test over varying conditions to minimize any potential error(s) in changing tests, such as if calibration settings may need to be changed and/or different connections or probe points need to be made. Varying the conditions while executing the same test may minimize error in such results and allow for a consistency in analyzing test results for sources of error.

In various embodiments, the same test may be executed multiple times with the same conditions. If a first execution of a test results in unacceptable test results, but the test station identifies a source of error that may be corrected by the test station 104 or by a technician at the test station 104, the test may be executed one or more additional times. This may occur automatically or an alert may be generated to indicate to a technician to repeat a test. Automatic retesting may occur if a test is within an excepted test result criteria but there is a margin of error that allows of a possibility of a test result exceeding the criteria.

In various embodiments where the test station or a technician may tune an RF module 400, the same test may be executed one or more times after tuning has occurred, which may include multiple iterations if multiple tuning actions occur (e.g., additive tuning with multiple additions of epoxy). In various embodiments in which there is tuning, the test station may generate test data that includes test data associated with the tuning, including, but not limited to, the tuning action that occurred, the location of the tuning, changes in the test results due to the tuning, an image or video of the RF module 400 before and after the tuning, time stamp(s), environmental conditions, etc.

At operation 510 of FIG. 5, if test results for the one or more tests executed by a test station 104 on a RF module 400 are acceptable, the tests may end. In various embodiments, test station 104 may, at the end of test results, generate a summary of test results or indication of acceptable test results. A summary may include test results as well as thresholds, ranges, calibration settings, maintenance data, and technician data, associated with the tests executed. In various embodiments, when tests end, data or data objects comprising test results, summary of test results, or indication of acceptable test results may be transmitted to a user device 106 and/or a server 108.

At operation 512 of FIG. 5, if test results for one or more tests executed by a test station 104 on a RF module 400 are not acceptable, there may be a determination of a source of error. The determination of a source of error may be performed by the test station 104, user device 106, server 108, and/or a combination of the preceding. While a source of error may be due to manufacturing, and the RF module 400 may not satisfy the expected test results, the source of error may be due to an improper test and the error may occur when an RF module 400 is within specification and meets the expected test results but for the error in the testing process. Diagnosing such errors may be difficult and may lead to unnecessary tuning of an RF module. False errors may be determined by analyzing test data, including test results. Additionally, the test data may be analyzed to determine if an error is likely to occur due to the testing process, particularly the test stations 104, and thus prevent future false errors.

Figure 6:
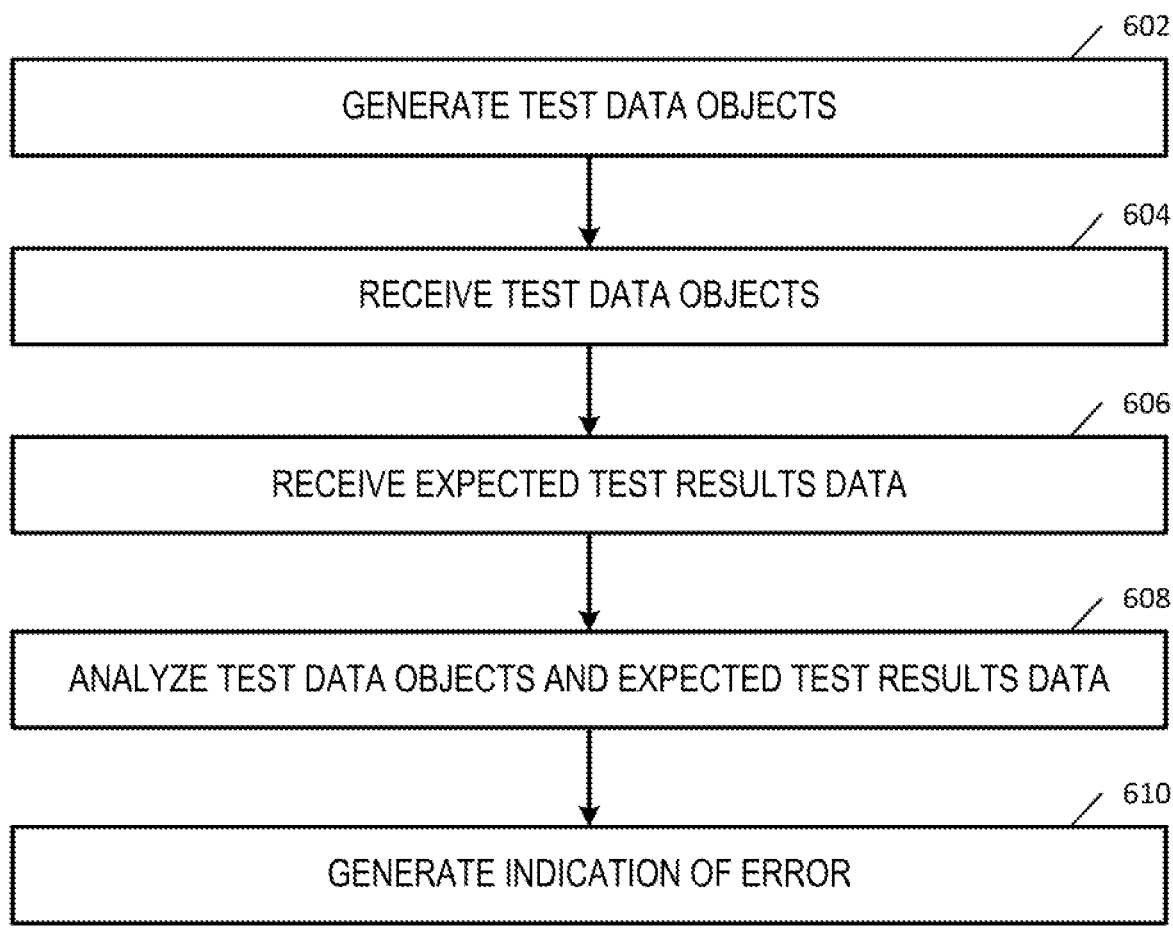
FIG. 6 illustrates a flowchart depicting example operations of a process for test data analytics in accordance with at least some example embodiments of the present disclosure.

FIG. 6 illustrates a flowchart depicting example operations of a process for analyzing test data in accordance with at least some example embodiments of the present disclosure. In the various embodiments, a user device 106 and/or server 108 may analyze test data objects and expected test results to generate an indication of error. In various embodiments, the process of FIG. 6 may generate an indication of error associated with a test result that was determined to be unacceptable. In alternative embodiments, one or more test stations 104 may determine a source of error and generate an indication of error.

In one example, an RF module 400 may be loaded on a test station 104, including input and output ports 408 connected to test equipment. An electrical test may be run at DC to determine an RF module's response. The test, however, may fail to meet an expected test result. In this example, the failure may be due to a bullet connector at an input port 408 that has mechanically failed and thus prevents the electrical signal applied from testing the RF module 400 as normal due to the failure at the input port. The RF module may be within specification, but the failure of the connector, which may be a complete failure or a partial failure. Diagnosing such an error is difficult and resource intensive, particularly if a test being performed is one of a series of automated tests.

At operation 602 of FIG. 6, test station 104 may generate one or more test data objects. As described herein, test data objects may include data associated with the testing of a RF module 400 for one or more tests executed on a test station 104, including data regarding the RF module 400 under test and/or the test result data from the performance of one or more tests. In various embodiments, a test data object includes data associated with the test station on which a test is performed, such as test station identification data, calibration data, and/or maintenance data, as well as data associated with a technician, such as a technician identification. Alternatively, or additionally, test station data and/or technician data may be included in separate data objects that may be correlated to data objects containing test result data.

At operation 604 of FIG. 6, user device 106 and/or server 108 may receive one or more test data objects generated by one or more test stations 104. In various embodiments, the test data object(s) may be transmitted from one or more test stations 104, and this transmission may occur at the completion of each test, at the completion of all tests to be executed at the test station 104 for a RF module 400, upon the determination of unacceptable results, and/or in response to a request from user device 106 and/or server 108. In various embodiments where a test station 104 performs the analysis, this step may be omitted, or the test station 104 may receive test data objects from other test stations 104.

In various embodiments, a first test station 104 may execute a first test on a first RF module 400, and unacceptable test results may be generated. The first test station 104 may generate a first test data object associated with the first test. The first test station 104 may transmit the first test data object to a user device 106. The user device 106 may request one or more test results of similar RF modules 400 from one or more test stations 104 different from the first test station 104, such as a second test station 104 and a third test station 104. Each of the second test station 104 and third test station 104 may determine if it has tested a similar RF module to RF module 400. The second test station 104 may determine it tested a similar RF module 400 (e.g., second RF module 400) and has generated a second test data object comprising test results associated with the second RF module 400. Similarly, the third test station 104 may determine it tested a similar RF module 400 (e.g., third RF module 400) and generated a third test data object comprising test results associated with the third RF module 400. The second test data object and the third test data object may be transmitted to user device 106 in response to the request for test data results. Additionally, or alternatively, there may be additional test stations 104 and each test station 104 may transmit more than one test data object, such as when a test station 104 may have tested a plurality of RF modules 400 that are similar to the first RF module 400. Each of the test data objects received by the user device 106 may include calibration data, technician data, and maintenance data.

In various embodiments, the first test data object associated with the first test may include an identification of a RF module design, and the user device 106 may identify the RF module design and extract it from the first test data object to include the RF module design in the request for test data objects from the additional test stations 104, which may allow the additional test stations 104 to determine which RF modules 400 tested are similar to the first RF module 400. Additionally or alternatively, a RF module data object comprising a listing a RF module serial numbers associated with an RF module design as well as which RF module serial numbers have been or are to be tested by one or more test stations, and the RF module serial numbers may be used to determine and request test data objects from test stations 104 associated with the RF module serial numbers.

At operation 606 of FIG. 6, user device 106 and/or server 108 may receive one or more expected test results associated with a RF module 400. In various embodiments, the expected test results may be received after a query is performed, such as querying server 108 based on data from one or more of the test data objects, such as RF module identification data. The one or more expected test results may be received in a data object (e.g., an expected results test data object), which may be from a test station 104 or a server 108. The expected test results may include the output of a simulation or may include test data results from testing a golden unit on a test station. In various embodiments where a test station 104 may already have an expected test result data object, the version of the expected results test data object may be checked to determine if the version is current or if an updated version of the expected results test data object should be requested. For example, a simulation that has been updated and/or revised may generate and updated and/or revised expected results test data object. Checking only the version may reduce the bandwidth and time required to determine if the expected test result data object is up to date.

At operation 608 of FIG. 6, user device 106 may analyze the test data objects received and the expected test result data object. In various embodiments, after receiving the test data objects comprised of a plurality of test results, the user device 106 may classify each of the test result data, filter each of the test result data, and generate a test analysis data object for each test performed, which may also include a test data object for how each test may be varied (e.g., with different settings or conditions). Such test analysis data objects may improve analysis of the test results by reducing the amount of data to be evaluated, stored in memory, and/or processed when analyzing the results of one or more tests. The test results from the test data objects and the expected results test data object may be analyzed to determine, among other things, sources of errors, such as from manufacturing, calibration, maintenance, technician(s), or more than one of the proceeding. When a source of error is determined either to be due to or likely to be due to a non-manufacturing source of error, such as calibration, maintenance, or a technician, an alert may be generated to identify this source of error and assist in address the error.

In various embodiments, a test data object may be associated with one type of RF module design, one test station, and/or one technician. In various embodiments with a test data object associated with a first type of RF module design 400, the test result data of the test data object may be aggregated and used to determine trends over time, dates of errors, times of error, ranges of test results, variations in test results between test stations and technicians. Statistical analysis may be performed to analyze test results based on, for example, a specific test station or a specific technician. Additionally, test results may be compared to expected result test data associated with the first RF module design. While sources of error may be from incorrect manufacturing of a RF module, a comparison may determine that the source of error was not due to manufacturing, but due to the test process, such as with a test station's calibration, maintenance on the test station, the technician, or more than one of these sources of error.

A determination of the source of error being calibration may be determined, for example, by determining a part or portion of a test station is no longer properly calibrated for performing one or more tests. In various embodiments, one or more tests may be performed by a test station 104 for a plurality of RF modules 400. Over time, as RF modules 400 are tested, the portions of the test station may incur mechanical and/or electrical wear, which may impact its ability to property perform a test. For example, a test station 104 may include one or more electromechanical switches that may be used during testing. Operating an electromechanical switch may including resetting the electromechanical switch. However, when an electromechanical switch resets it may not return to the exact same state due to wear. The failure to return to exact same state may result in a small change in phase applied to a signal using the electromechanical switch. Thus, this small change in phase may change the phase in subsequent test signals that utilize the electromechanical switch for tests. Additionally, environmental factors (e.g., temperature, humidity, etc.) may change over time that may not have been compensated for that may cause a test station 104 to no longer be properly calibrated. Test equipment factors may also change over time (e.g., low battery, line voltages, etc.). The test result data may indicate a trend, such as a drift, in a measurement. In various embodiments, a trend may be indicated by measurements over time being higher or lower than expected. This may not be seen in instant test result data of one RF module 400, but it may be determined from analysis of test result data of a plurality of test results over time. Such a trend may be indicative of a calibration error. Additionally, calibration error may be present when an RF module passes a test, which may be due to the amount of error being introduced not being sufficient to generate a test error. Calibration errors are costly to determine if only found after errors are sufficient to cause test result failures are observed. By observing, for example, trends or applying statistical analysis to test result data, test station error due to calibration or failure of test stations to hold a calibration may be determined. In various embodiments, the calibration error may be determined from one or more calibration settings stored in the test result data, including by comparison of calibration settings between test result data for different RF modules between test stations 104.

A determination of the source of error as being a maintenance error may be determined, for example, and in part, by determining when a part or portion of a test station has been used for too long without receiving a maintenance service. In various embodiments, a maintenance error may include a part failure. For example, a connector may fail. In various embodiments, multiple tests may be performed with the same test station, and the same test station may be used to perform these tests on a plurality of RF modules. Over time, as RF modules 400 are tested, portions of the test station 104 may incur mechanical and/or electrical wear, which may impact its ability to properly perform a test through, for example, part failure or partial part failure. Such a failure may require maintenance to address. In generating test result data of RF modules over time, measurements that lead to, and are included in, the test result data may indicate a sudden change in a measurement (e.g., a drop in power across one or more frequency ranges). The sudden change may be large or a complete failure. Such changes may be indicative of a maintenance error. A maintenance error may also be indicated by an increase in ripple in measurements (e.g., gain loss, return, etc.), particularly in test signals with higher frequencies and/or higher amplitudes. A maintenance error may be confirmed as being a source of error if other measurements in the test result data do not indicate, for example, issues with calibration. Maintenance errors may be costly and difficult to diagnose, particularly if only found after errors are sufficient to cause test result failures are observed. Maintenance errors may be, in some embodiments, observed by one or more trends occurring over time followed by a sudden change, which may be indicative that maintenance on the test station needs to be performed as a part or portion of the test station has failed, is failing, or is in partial failure. By observing, for example, trends, sudden changes, or applying statistical analysis to test result data, test station error due to maintenance error may be determined. In various embodiments, the maintenance error may be determined from test result data, including by comparison of test result data between test result data for different RF modules on one or more test stations 104.

A determination of the source of error being a technician may be determined, for example, by determining when one or more technicians using one or more test stations 104 are consistently associated with an error in test result data. In various embodiments, one or more test stations may be operated by a technician, and the technician may be encountering errors either in the operation of the test station, in needing to perform a test repetitively, or in needing additional time to complete a test, any of which may be indicative of technician error. In various embodiments, a technician may be associated with calibration error and maintenance error, which may be valid on their own, but may be induced due to the actions or inactions of a technician. Test result data may include an identification of a technician (e.g., name, technician number, unique code), and analysis of test result data associated with the technician may determine the technician is inefficient and/or introducing errors. For example, a technician's connection of scopes to an RF module may bend a pin in the connector or fail to connect one or more connectors properly, which may cause a test to fail or to pass but trend high or low on a respective test. In various embodiments, the number of such errors or passes with trends may be analyzed in view of other technicians utilizing the same test station or other technicians utilizing the test station 104 to determine if a particular technician is introducing error.

Additionally, or alternatively, technician error may be specific to a particular test station but not to a particular technician. For example, a plurality of technicians may utilize the same test station and each encounter higher than expected errors, but the same technicians may not have issues on other test stations. In various embodiments this may be due to environmental conditions surrounding the test station that induces technician error. For example, the location of the test station may be adjacent to other equipment or machinery that causes issues or may have other working conditions. In various embodiments, identification of such technician errors due to the environment may not be possible but for analysis of test result data across multiple test stations and technicians.

The analysis of test results may utilize statistical analysis to determine trends, averages, medians, modes, variations, standard deviations, etc. This may include exceeding one or more thresholds or averages. In various embodiments, as test results data is generated during testing of RF modules 400, the test results data may be used to revise the trends, averages, medians, modes, variations, standard deviations, etc. Such revisions may be in real-time to dynamically revise these values or may be at scheduled times. By implementing such revisions these values may be used in determining sources of errors to account for real test values as opposed to theoretical or expected values. In various embodiments, a desired outcome may be based on a theoretical design, a simulation, test results of a golden unit, or more than one of the preceding. Previous test results of a golden unit may serve as a baseline, or test results of multiple golden units may serve to set an acceptable amount of variation from a manufacturing processes. In various embodiments, golden units may be identified during testing, and a golden unit may be tested at some of or all of the test stations to determine variation between the test stations. Similarly, a golden unit may be tested at a test station after an error is encountered at the test station to generate test result data for a golden unit while having a test station and technician be the same. Test result data based on golden units is helpful, though it may not include how test stations and technicians perform over time, which may be addressed by incorporated test result data.

At operation 610 of FIG. 6, if an analysis at operation 608 determined an error occurred, user device 106 may generate an indication of error. Alternatively, if an analysis at operation 608 determines there is no source of error, the process of FIG. 6 may generate an indication that there are no errors (not depicted), which may be provided to a user device 106 or stored on a server 108.

In various embodiments including an error, after determining a source or sources of error from analyzing test results and expected test results data, an indication of error may be generated. The indication of error may trigger an alert and/or an electronic communication to a user or a technician (e.g., warning light, on screen notification, email, SMS, etc.). For a test station with a display, an alert or an alarm may be visualized as some or all of a dashboard, and the visualization may indicate where an error occurred, such as the measurement generating the error as well as where in a test process the error occurred.

A display may have one or more dashboards, including a dashboard for maintenance, for calibration, or for the technician in addition to a dashboard for the specific test being run. A dashboard for maintenance, for calibration, or for the technician may incorporate test result data from prior tests at the test station or test result data from other test stations to visualize how the current test result(s) compares to other test results. A dashboard may allow for a technician or others to drill down into additional data related to individual test results. Drilling down into additional data may have the test station displaying the data communicated with a server or other test stations by requesting additional data stored off the instant test station and, on receiving the requested data, visualization of the requested data on the display. This may provide insight to the technician as well as to any additional technicians that are attempting to address the error.

An error data object may be generated that includes the indication of error along with the test result data and the expected test results data analyzed leading to the indication of error. In various embodiments, the error data object may include a plurality of visualizations of the indication of error, the test results, and the expected test results. In various embodiments, the error data object may be incorporated into the test results data object along with expected test results data. Such an incorporation may include adding metadata or classifying the portion of the test results data associated with the indication of error.

An indication of error may be presented to a user or a technician. A user may be presented the indication of error on a user device 106. A technician may be presented the indication of error on the test station 104, which may include one or more displays 310. The user device 106 and/or test station 104 display 310 may include one or more dashboards. Additionally or alternatively, a user or a technician may be presented with a dashboard of lot performance from the testing of lots. The dashboard of lot performance may present, among other things, a lot code, a lot date, an electronic part sheet, a variation in performance from a test result and the expected test result, any associated error, etc.

In various embodiments transmitting unacceptable test result data in real-time, the indication of error may be generated while the technician is continuing to test the RF module 400 that generated the indication of error. The presentation of the indication of error may allow the technician to take remedial action to address the error. For an indication of error associated with a calibration setting, the technician may recalibrate the test station 104 or, for an automated test, recalibration settings may be requested from user device 106, server 108, or other test stations 104 and then implemented on receipt. Additionally, or alternatively, recalibration settings may be generated or queried and then sent to a user, technician, supervisor (e.g., manager, engineer, etc.), or test station for use in recalibrating the test station. For an indication of error associated with maintenance, the technician may perform the maintenance or, if unable to perform the maintenance, may stop performing testing at the test station and change test stations. For an indication of error associated with the technician, the presentation may include how a test may be performed differently or instruct that a second technician assist or observe the technician in performing one or more tests. In various embodiments, the presentation may be displayed as a visualization on the display of test station 104, which may include one or more steps or instructions that a technician should take in performing a test, which may also include any calibration settings that should be used. The test station 104 may also generate a request for another technician to join the first technician and send the request via an electronic communication to the second technician.

In presenting an indication of error to a user or technician, in addition to the error, a visualization of the test results associated with the error in view of trends and/or aggregated test results may be displayed. A trend may be presented for a first test that visualizes how execution of the same test over time across a plurality of RF modules results in a downward trend of results until a lower threshold has been reached or is being approached. A user or technician may, upon observance of the trend, recognize a calibration or maintenance issue with a part or portion of the test station experiencing wear or other degradation and tear as test are executed. In various embodiments in which an RF module was tuned, the trend line may be associated with how the tuning of the model continued until a lower threshold was exceeded.

In various embodiments, visualizations may include trends or averages in view of sigma limits. Visualizations may be associated with a RF module design, a test station, a technician, a test, a calibration setting, and/or maintenance schedule. The visualizations may provide indicators of potential failures, which may be determine by predictive analytics. For example, analyzing test results for failures associated with other test stations, a trend in an instant test station may be determined to be associated with a likely failure. An indicator of the potential failure may be displayed.

In various embodiments, indications of error may be stored along with the test results data and the expected test result data associated with the indication of error. If a subsequent error arises, the stored indications of error may be queried to determine if a similar calibration setting, maintenance item, or technician is associated with a previous indication of error, which may be used to determine trends. Additionally, indications of error may be used to revise designs and simulations of RF modules 400, which may revise expected test results, calibrations settings, and/or testing procedures.

In various embodiments, when an indication of error is determined, a work order may be generated. The work order may be an electronic report sent to another technician or a repair person, such as someone who may calibrate a test station or perform maintenance. In various embodiments with technician error, the work order may be an electronic communication of a training order to a trainer that may train a technician in executing a test procedure. A work order may be generated automatically and transmitted via an electronic communication. A work order may include identification of the test station, the RF module tested, the technician, environmental conditions, and time and date stamps, test associated with error, etc. The work order may also include a visualization of the test data results that led to the generation of the work order. Additionally, the work order may include a remedial suggestion of work to be performed to address the error, such as the calibration to be performed, the maintenance to be performed, or the training to give the technician.

In various embodiments, if a trend is detected over time for a test station and multiple units pass but by a margin that is lower than desired, such as if a test station may need to be recalibrated, a retest indication may be generated for one or more previously tested RF modules 400 previously tested on the instant test station. In an embodiment where a test measurement was within a narrow margin of generating an error but a test station is trending to test units in a manner that would bias the test measurement to be acceptable, a measurement on a different test station may result in a previously test RF module 400 generating an error in a subsequent test. The retest indication generated indicates the RF modules 400 to retest to determine accurate tests without the bias of the test station.

For example, a technician may be testing an RF module 400 over a range of frequencies for a noise that may be found acceptable if it falls under a threshold or within a particular range. The technician and/or a second or further technician may have previously tested RF modules 400 with the same design on the same test station, each of which passed the test. Now, however, the instant RF module 400 under test may be found to fail the instant test. The test result data from the previous tests may be used with the failing test result data from the instant test to determine if the error is due to calibration, maintenance, or the technician. Determining a trend in the average noise from the prior test results to the current test and determining that the noise has increased until a threshold has been exceed may indicate that a calibration error occurred. Determining a trend in average noise changing and then a sudden increase may indicate that the test station or test setup has a failure and that maintenance is needed to correct the sudden increase in noise. Determining that noise fell within an acceptable range and below a threshold in prior test result data on the instant test station for a second technician but is now higher for the instant technician indicates that the technician may need training or guidance on how to conduct the instant test.

The RF modules may be simulated prior to manufacturing, and the test results from testing the RF modules may be used to improve simulations. Such improvements may include, among other things, validating simulations to improve confidence levels as well as correcting simulation models. Corrections to simulation models may include correcting for incorrect values of one or more modeled component or one or more circuits based on two or more components.

Simulations may be based on theoretical components, ideals components, or averages of previous components that make up a circuit. The simulations may set base values for expected test results of all or a portion of an RF module under test. The simulations, however, may fail to consider a number of sources of variation or error that may exist in, among other things, manufacturing or testing. By incorporating test result data, including accounting for error in test data, simulations may improve the current design and future designs as well as updated expected test results. Additionally, the incorporation of test result data may identify additional tests to perform and/or simulations to perform.

Depending on the test to be performed, simulations may identify specific points to test at, which may be referred to as test points. It is appreciated that test points may be more than point, such as a range of points to be tested. Test points may be generated to test where a simulated stress point that may be more likely to fail. For example, test points may, for certain tests, be hot spots that have a higher temperature in an RF module than elsewhere in the RF module. Another example involving an electrical test may include a simulation indicating a test point and a range of frequencies to test over to determine an amount of noise within a system. Additionally, test points may be associated with control points that are more likely not to fail but are indicative of a correctly performed test, such as a DC value being measured to determine if an electrical connection is properly made to an input port.

In various embodiments, the circuits and/or circuit components may have their values for the simulation stored in a library data object. A library data object may initially contain theoretical or idealized values. Such values may be different from an actual value due to variation in manufacturing at the component manufacturer, and even components manufactured by the same manufacturer have variation. A test station may perform testing of components as lots as components are received from a manufacturer but before the components are used in the manufacturing of an RF module. The lot testing may include testing a sample or samples of each lot or may include testing each component in the lot. The test results from component testing may be incorporated into the simulation, including using statistical analysis to determine value for the simulation. In one embodiment, an average, median, mode, standard deviation, and variation for the components in a lot may be determined and provided to the simulation. Incorporating the component values may allow for the simulation to be revised to generate expected test results, which may be incorporated into the tests performed on the RF modules. The components may include a serial number or other component identification code to uniquely identify the components, and this may be used to incorporate specific components into models instead of averages.

Figure 7:
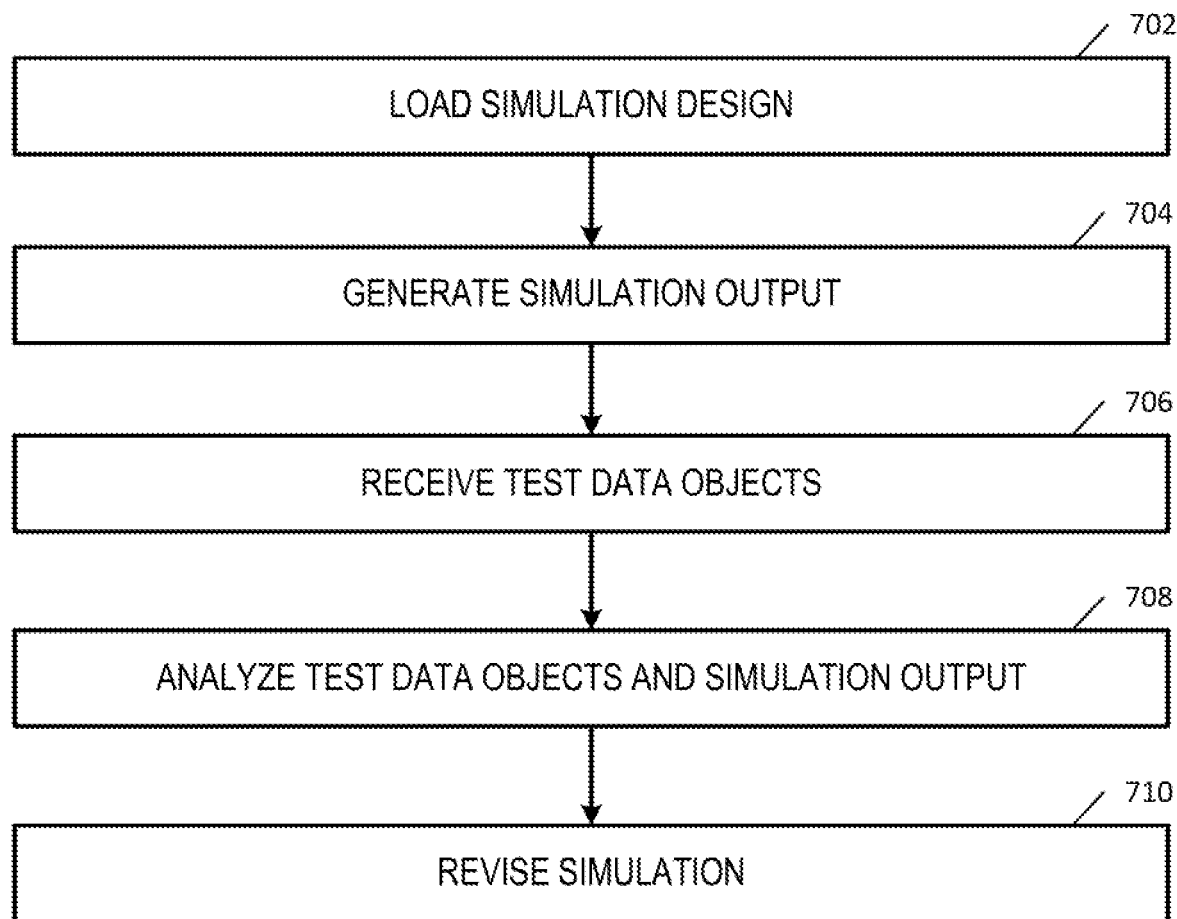
FIG. 7 illustrates a flowchart depicting example operations of a process for simulations in accordance with at least some example embodiments of the present disclosure.

FIG. 7 illustrates a flowchart depicting example operations of a process for simulations in accordance with at least some example embodiments of the present disclosure. The process may be implemented to improve simulations, which may be done automatically or by a user. In various embodiments where the process is automated, the process may occur on a schedule or after a trigger, such as receiving first test results, new test results, a quantity of test results, or on a determination of an error. Triggering revising of simulations on generation of test results of components or RF modules 400 may allow for real-time revisions to simulation models, which may allow for real-time revisions to expected test results that may be provided to test stations 104.

At operation 702 a simulation design is loaded. In various embodiments, simulations may be stored on a user device 106 or a server 108. A simulation may be identified based on an identification code associated with an RF module 400. In various embodiments, the test results may be received by a user device 106 in a test data object, and the identification code associated with the RF module 400 associated with the received test results may be extracted from the test results. The user device 106 may select the simulation to load based on the identification code and the simulation of the RF module 400 may be loaded. In alternative embodiments, a user of user device 106 may identify an RF simulation module by inputting an identification code via input keys of the user device 106.

At operation 704 a simulation generates output. In various embodiments, once the simulation is loaded, the simulation will be run to simulate the RF module. The simulation generates output, which may be output corresponding to one or more of the tests performed on the manufactured RF module 400. For example, simulation output may include phase and/or gain matches and/or track. In another example, simulation output may include one or more plots and/or statistical process controls (e.g., averages, standard deviations, bot plots, etc.). The simulation output may indicate if an RF module's design is within required margins and what tolerances or margin the simulated design has until the tolerances would be exceeded. The simulation output may be in a format similar to the test result data format or may be distinct from the test result format. When simulation output is in a different format, user device 106 may convert the format to a format of the test result data such that these data may be compared. Simulations and test data may be stored in proprietary formats or may be stored as raw data values without formatting or descriptions of the type of test being performed, and converting to a common format allows the data to be compared, including to determine types of errors based on the data.

At operation 706 test data objects are received. A user device 106 or server 108 may receive test data objects containing test results, such as from one or more test stations or from a server 108 storing test data objects. The test data objects may be received in response to a query of the one or more test stations, which may be queried according to a schedule or a trigger, such as the loading of a simulation design. In various embodiments, when an RF simulation design is loaded a query may be generated to determine if there are any test data objects with test results related to the RF simulation. If a determination is made that related test results objects are present, a response may include providing the related test data objects. Alternatively, or additionally, when new test data objects with test results related to an RF simulation design are generated they may be pushed to user device 106 or server 108 to be incorporated into the simulation design. This may occur in real time, or the test data objects may be batched together to be provided on a regular schedule or once a certain number of test data objects are generated. Test data objects may contain a large amount of data and thus the size of test data objects may be large, so the scheduling of when to send test data objects may monitor an internal network for slow periods and push the test data results when networks are slower or may be scheduled to push the test data objects during historical network slow times (e.g., overnight when no or fewer shifts are working), which may reduce network congestion. Alternatively, or additionally, the query and receipt of test data result objects may occur when user device 106 or server 108 is not busy to optimize their down time.

At operation 708 the test data objects and the simulation output are analyzed. The test results may be extracted from the test data objects and analyzed in view of the simulation output. In various embodiments, the test data objects may include a plurality of test results, some of which may not be relevant to the simulation output. The analysis of the test data objects may identify the relevant test results in the test data objects from the simulation output, which may be done by analysis of metadata, which may include tagging or classification of the data in each of the test data results and the simulation output. The analysis may compare the simulated output to the actual measurements. In various embodiments, if the actual measurements confirm the simulation then the confirmation may be recorded and a confidence score or confidence level may be adjusted to indicate the confirmation. In various embodiments, if the actual measurements deviate from the simulation output by a specified margin, an alert may be generated that there is a deviation. The alert may be displayed to a user and/or may generate an electronic communication to a user of a user device 106 to inspect the simulation.

At operation 710 the simulation is revised to incorporate the analysis of the test data objects and the simulation output. In various embodiments, a user may, after receiving an alert, input an approval to incorporate test results or, alternatively, may deny the incorporation of test results. If the simulated output deviates from the test results, the deviation may be incorporated. The analysis may indicate the reason for the deviation, which may be, for example, a component value in the test results being measured with an actual value that deviates from the simulated value. In another example, a simulation may incorporate values from mechanical test to account for deviations in manufacturing, such as for wall thickness, trace width, bend radius, etc. In another example, a simulation may incorporate tuning actions that occurred, such as removal of jumpers.

After revising the simulation, the simulation may be run with the revisions. The simulation output of the revised simulation may then be compared again to the test results and, thus, iterations of some or all of the operations in FIG. 7 may occur.

In various embodiments, when test data results related to a component are incorporated, the simulation model may update a library containing a component value. In various embodiments that measure component values when components are received and measured, the test data object may contain test results of component values. A simulation may analyze the simulated component values and the measured component values, and if there is a deviation the simulation may update the library used by the simulation with the measured component value(s). The simulation may be rerun to determine if the simulation continues to be within requirements.

Test data from prior simulation models may be imported into new models. In creating a new simulation model a user may select prior simulation models, and prior simulation models indicate if test data is available associated with the prior simulation model. Alternatively, or additionally, when a new simulation model incorporates some or all of prior simulation models, the simulator may check prior simulation models to determine if a prior simulation model is related to the new simulation model. If a relationship is determined, the user may be alerted or the simulator may automatically incorporate all or a portion of a prior simulation model. Prior simulation models may include confidence values or confidence levels indicative of confidence in the simulation in view of test results measured during testing. A confidence level may be increased as larger numbers of RF modules 400 are tested and the test data supports the simulated model of the RF modules. Similarly, a confidence level may decrease if test data diverges from the simulated model. A simulation user may be presented with the prior simulation model and, if available, the confidence value, and the user may provide instructions to incorporate the prior simulation model as well as the test result data.

In an example, the incorporation of test data for prior simulation models may address frequency ranges not used in the new simulation model but used in a prior simulation model. In a prior simulation model a RF module 400 may be modeled for use with a first frequency range (e.g., 24-44 GHZ) while a new simulation model may use a second frequency range (e.g., 77-96 GHz). The change from the first frequency range to the second frequency range will result in different responses by simulation model. Prior test data associated with the prior simulation model at the first frequency range, particularly as the first frequency range in this example approaches the second frequency range, may be used in simulating the new simulation model. The test data may validate the new simulation model for some or all of the new simulation model related to some or all of the prior simulation model, such as where similar components or circuits are shared between the two simulation models. Validating the simulation mode may include comparing the amount of variation in the new simulation model to the test data of RF modules relating to the prior simulation model. Validation may also include comparing minimums, maximums, averages, standard deviations, etc. for how the simulation models and test data perform over parameters tested for during tests described herein (e.g., gain, noise figures, etc.).

In a second example, a new simulation may be modeled on a prior simulation but with a new or updated component. This may be necessary due to a prior component no longer being manufactured or a supply of the component running out. Simulations of the model using the new component, particularly if test data is available from testing lots of the new component, may be used to determine what impact, if any, the new component has on the model. The simulation may also generate a visualization of the differences between the two simulations over a number of a parameters tested for, including how each simulation performs over frequency ranges tested over. The simulation may also determine the maximum or minimum difference between the components and at which frequencies. A user may set a margin of error or deviation from prior model that is acceptable, and the simulation may generate a report indicating if the replaced part is acceptable and where any margins are being tested, and the report may be provided to one or more users via an automatically generated communication.

A plurality of RF modules 400 may be combined together to create an RF assembly, such as depicted in FIG. 4B. Multiple copies of RF modules 400 used in the RF assemblies may manufactured to create multiple RF assemblies. While embodiments discussed herein may only have a first RF module 400B and second RF module 400C, the discussion is applicable when more than two RF modules 400 are used to an RF assembly with three or more RF modules.

While each copy of, for example, a first RF module 400B should match a theoretical specification (e.g., a simulated model), there are variations to each copy of the first RF module 400B manufactured due to variations in, for example, component values, manufacturing, tuning, etc. Variations in each of the RF modules combined to create an RF assembly may result in an RF assembly deviating from a desired specification. The deviation from the specifications or models of the overall RF assembly may only be discovered during the testing of the overall RF assembly, which may be too late adjust which RF modules 400 are used in the RF assembly if all RF modules 400 have been assigned to one of a plurality of RF assemblies. Thus the selection of which copies of RF modules 400 to use to create RF assemblies prior to creating the RF assemblies requires analysis of the test results. The analysis may include determination of actual mechanical and electrical characteristics, which are determined through the testing of the RF modules. Thus RF modules 400 may be chosen to meet electrical characteristics (e.g., noise, gain, frequency response at specific frequencies, etc.) required by the specific application the RF assembly is used in. Simulated modules combined as an assembly should all theoretically meet specified requirements for the RF assembly, but manufacturing may introduce variation that results in failing to meet requirements of an assembly. There is a need to determine which RF module 400 may be used together to combine into acceptable RF assemblies.

Figure 8:
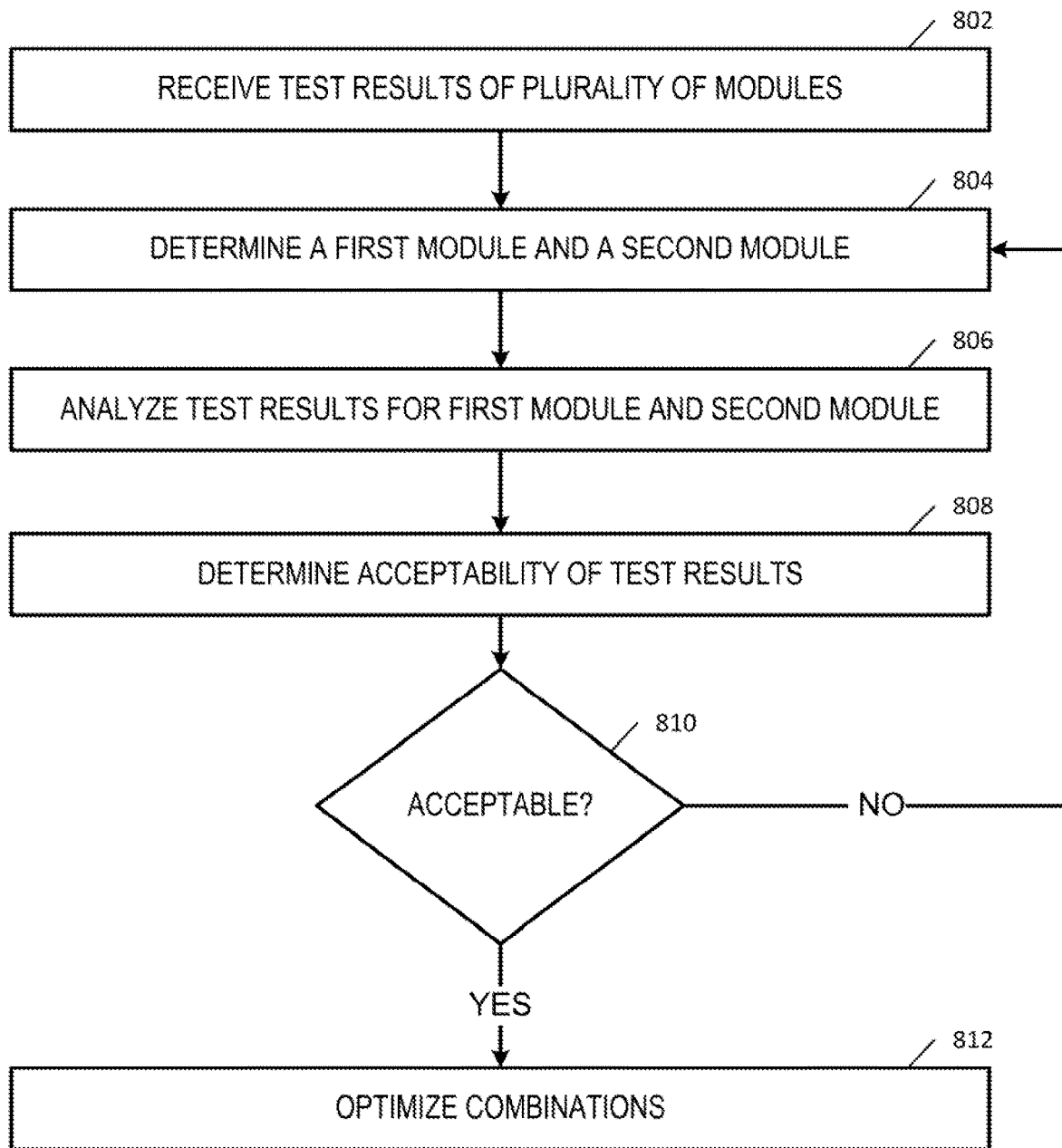
FIG. 8 illustrates a flowchart depicting example operations of a process for determining RF assemblies with at least some example embodiments of the present disclosure.

FIG. 8 illustrates a flowchart depicting example operations of a process for determining RF assemblies with at least some example embodiments of the present disclosure. In various embodiments, the determination may occur at a test station 104, a user device 106, or a server 108.

At operation 802 test results of a plurality of RF modules 400 are received. The test results may be in test data objects. The test data objects may be received in response to a requested query or automatically. In various embodiments, the test data objects may be received automatically after testing the last RF test module required to have a specific number of RF modules 400 needed to complete the RF assemblies. In various embodiments, only the specific number of RF modules 400 needed to create the required number of RF assemblies is manufactured, and RF modules 400 are tuned (e.g., additive tuning or subtractive tuning) if an RF modules 400 is outside of specification. However, even when RF modules 400 are within specification, there is variation among the RF modules 400. The received test data objects include the test results for each of the RF modules 400, including how each may vary from specification.

At operation 804 a determination(s) of a first RF module 400B and second RF module 400C to be combined for an RF assembly is made. There may be multiple iterations of determinations of which modules are to be paired in creating a RF assembly. A first determination may randomly pair the RF modules 400 or the determination may be sequentially. Alternatively, the determination may be made when during analysis of the test results of the RF modules 400.

At operation 806 the test results for the RF modules 400 used in each RF assembly are analyzed. In various embodiments the analysis may include the test results from a first RF module 400B of a first design and a second RF module 400C of a second design. Analyzing the test results may include how, when the first and second RF modules 400 are combined, the RF assembly performs electrically. The analysis may be through a simulation based on test results and/or the analysis may be by combining the test results. The simulation or combination of test results may be by test station 104, user device 106, and/or server 108. This step may generate expected test results for RF assemblies.

At operation 808 a determination is made if test results for each of the RF modules 400 is acceptable. The determination may be made for each RF assembly, and thus the determination will determine if all combinations of first RF modules 400B and second RF modules 400C as RF assemblies results in the RF assemblies being acceptable in view of specifications. The determinations may be made based on a criteria list that includes criteria for the RF assembly. In an example, all RF assemblies may be required to have a specific gain without having a specific noise margin, and the determination may account for all of the variations determined through testing the individual RF modules 400 to have the RF assemblies meet specification.

At operation 810, if the combinations of RF modules 400 in RF assemblies fails to result in acceptable RF assemblies, the combinations are revised. In various embodiments, this may be performed by returning to operation 804. In the revision, the prior combinations of RF modules 400 may be classified as being unacceptable combinations in a list of criteria for combinations.

At operation 812, and after acceptable combinations of RF modules 400 for RF assemblies are determined, the RF modules 400 in each combination may be optimized. In various embodiments, the optimization may occur during prior operations, but due to burdens in optimizing the combinations it may be performed separately after first determining acceptable combinations of RF modules 400 to create RF assemblies. Optimization may occur to determine if RF assemblies may be created that provide the most robust electrical responses based on test results in view of the RF modules 400 used to create the RF assemblies. In various embodiments, where an RF assembly is used may have greater exposure to different environments, which may cause optimization to be based on different electrical characteristics (e.g., noise, gain, filtering, etc.). The electrical characteristics may be prioritized to determine where robustness is more of a priority. For example, a first electrical characteristic may be prioritized over a second, which may be prioritized over a third. Alternatively, a first and second electrical characteristic may be tied for priority over a third. As yet another alternatively, a first electrical characteristics may be prioritized over a second and third with the second and third being tied for lower priority. Optimization may take into account the priorities in how RF modules 400 may be combined to provide the most robust RF assemblies for the electrical characteristics having the highest priorities.

In various embodiments, simulations are used to determine combinations of RF modules 400 for use in RF assemblies. A plurality of first RF modules 400B of a first design and a plurality of second RF modules 400C of a second design are to be combined as RF assemblies. For example, 10 RF modules 400B may be manufactured and 10 RF modules 400C may be manufactured to be used to create 10 RF assemblies. To identify the combinations of the 10 RF modules 400B to pair with the 10 RF modules 400C, a simulation may determine the combinations. A simulation may load a model of each RF module 400B, 400C and analyze the combinations against performance criteria required of the RF assembly. Having already tested each of the first RF module 400B and each of the second RF module 400C, the simulation may load the test results data and iteratively simulate the combinations of the 10 RF modules 400B and the 10 RF modules 400C to determine their performance as an RF assembly. Each of the iterative simulations may generate a simulation output, which may be compared to criteria for a combination. The criteria for a combination may include one or more of the parameters tested for (e.g., noise, gain, S-parameters, etc.). The criteria may contain thresholds or ranges, and as a threshold is met and a value is in (or outside) of a specified range then the criteria may be deemed as acceptable. As combinations of the first RF module 400B and the second RF module 400C are determined to meet the required criteria, a listing of successful combinations is generated. The use of test result data allows for variations in the RF modules 400 due to manufacturing and tuning that are not in the idealized simulation.

In various embodiments, simulations are used to optimize the combinations of RF modules 400 for RF assemblies. Continuing with the above example, while the 10 RF modules 400B and 10 RF modules 400C were determined to meet the criteria for RF assemblies, the combinations may be optimized. The optimization may be based on a weighting of the criteria. For example, it may be more important have a lower value of one criteria (e.g., noise) than of another criteria (e.g., compression point). The criteria may be weighted based on the importance. The weightings may be set by a user before or during the simulation. The simulations may be run again to re-determine the combinations of 10 RF modules 400B and 10 RF modules 400C to generate optimized combinations of RF assemblies based on test result data. Additionally, during optimization, one or more tuning recommendations may be generated to improve one or more of the RF modules 400 to achieve an improvement in the RF assembly in view of the criteria. The tuning recommendations may be based on the revised simulations as well as identifying tuning or improved test results associated with another of the RF modules 400 used during the optimization simulations. As the use of test result data allows for variations in the RF modules 400 due to manufacturing and tuning to be taken into account, optimization based one criteria is possible to provide improved RF assemblies that improve the robustness of all RF assemblies while meeting the required criteria for an RF assembly.

Once the determination of RF assemblies is complete, the RF assemblies may be assembled. The resulting RF assemblies may be tested to ensure compliance with the expected test result of the RF assemblies. These test results may be used to validate the expected test results. For expected test results for RF assemblies generated through simulation, the test results for RF assemblies may be used to improve the simulations, such as described in FIG. 7.

Although exemplary systems and exemplary methods have been described above, implementations or embodiments of the subject matter and the operations described herein can be implemented in other types of digital electronic circuitry, computer software or program, firmware, or hardware, including the structures disclosed in this specification and their structural equivalents, or in combinations of one or more of them.

Embodiments of the subject matter described herein can be implemented as one or more computer programs, i.e., one or more modules of computer program instructions, encoded on computer storage medium for execution by, or to control the operation of, information/data processing apparatus. Alternatively, or in addition, the program instructions can be encoded on an artificially-generated propagated signal, e.g., a machine-generated electrical, optical, or electromagnetic signal, which is generated to encode information/data for transmission to suitable receiver apparatus for execution by an information/data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described herein can be implemented as operations performed by an information/data processing apparatus on information/data stored on one or more computer-readable storage devices or received from other sources.

The term "data processing apparatus" as used above encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a repository management system, an operating system, a cross-platform runtime environment, a virtual machine, or a combination of one or more of them. The apparatus and execution environment can realize various different computing model infrastructures, such as web services, distributed computing, and grid computing infrastructures.

Computer software or computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A computer program can be stored in a portion of a file that holds other programs or information/data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described herein can be performed by one or more programmable processors executing one or more computer programs to perform actions by operating on input information/data and generating output. Processors suitable for the execution of a computer program include, by way of example, both general and special purpose microprocessors, and any one or more processors of any kind of digital computer. A processor may receive instructions and information/data from a read-only memory or a random access memory or both. The essential elements of a computer are a processor for performing actions in accordance with instructions and one or more memory devices for storing instructions and data. A computer may also include, or be operatively coupled to receive information/data from or transfer information/data to, or both, one or more mass storage devices for storing data, e.g., magnetic, magneto-optical disks, or optical disks. However, a computer need not have such devices. Devices suitable for storing computer program instructions and information/data include all forms of non-volatile memory, media, and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described herein can be implemented on a computer having a display device, e.g., a LCD (liquid crystal display) monitor, for displaying information/data to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user device 106 in response to requests received from the web browser.

Embodiments of the subject matter described herein can be implemented in a computing system that includes a back-end component, e.g., as an information/data server, or that includes a middleware component, e.g., an application server, or that includes a front-end component, e.g., a client computer having a graphical user interface or a web browser through which a user can interact with an implementation of the subject matter described herein, or any combination of one or more such back-end, middleware, or front-end components. The components of the system can be interconnected by any form or medium of digital information/data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits information/data (e.g., an HTML page) to a user device (e.g., for purposes of displaying information/data to and receiving user input from a user interacting with the user device). Information/data generated at the user device (e.g., a result of the user interaction) can be received from the user device at the server.

While this specification contains many specific implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method for determining a combination of RF modules for an RF assembly, the method comprising:
    testing, at one or more test stations, a first plurality of first RF modules;
    generating, by the one or more test stations and based on the testing of the first plurality of first RF modules, a plurality of first test result data;
    testing, at the one or more test stations, a second plurality of second RF modules;
    generating, by the one or more test stations and based on the testing of the second plurality of second RF modules, a plurality of second test result data;
    receiving criteria data for a combination of first RF module and second RF module for a first RF assembly; and
    determining a first plurality of combinations of the first RF modules and the second RF modules for a first plurality of RF assemblies based on the criteria data, plurality of first test result data, and plurality of second test result data by applying a weighting of the criteria data to prioritize the criteria data.

2. The method of claim 1, wherein determining a first plurality of combinations of the first RF modules and the second RF modules comprises simulating the first plurality of combinations of the first RF modules and the second RF modules as RF assemblies.

3. The method of claim 1, the method further comprising:
    determining whether the first plurality of combinations of the first RF modules and the second RF modules may be optimized based on the criteria data, the plurality of first test result data, and the plurality of second test result data; and
    determining, based on a determination the first plurality of combinations may be optimized, a second plurality of combinations of the first RF modules and the second RF modules based on the criteria data, the plurality of first test result data, and the plurality of second test result data.

4. The method of claim 3, wherein determining whether the first plurality of combinations of the first RF modules and the second RF modules may be optimized comprises simulating the first plurality of combinations of the first RF modules and the second RF modules as RF assemblies.

5. The method of claim 1, the method further comprising:
    generating a visualization including an indication of the first plurality of combinations of the first RF modules and the second RF modules for the first plurality of RF assemblies; and
    transmitting, for display, the visualization in an electronic communication to a user device.

6. The method of claim 1, the method further comprising:
    determining, prior to determining the first plurality of combinations of the first RF modules and the second RF modules for the first plurality of RF assemblies, whether each of the plurality of first test result data are acceptable and each of the plurality of second test result data are acceptable; and
    wherein determining the first plurality of combinations of the first RF modules and the second RF modules for the first plurality of RF assemblies based on the plurality of first test result data and the plurality of second test result data excludes each of the first plurality of first RF modules and each of the second plurality of second RF modules associated with test result data that is not acceptable.

7. A computer program product, the computer program product comprising a non-transitory computer readable medium storing computer-readable program instructions, the computer-readable program instructions configured, upon execution by a processor, to:
    test, at one or more test stations, a first plurality of first RF modules;
    generate, by the one or more test stations and based on the testing of the first plurality of first RF modules, a plurality of first test result data;

test, at the one or more test stations, a second plurality of second RF modules;
generate, by the one or more test stations and based on the testing of the second plurality of second RF modules, a plurality of second test result data;
receive criteria data for a combination of first RF module and second RF module for a first RF assembly; and
determine a first plurality of combinations of the first RF modules and the second RF modules for a first plurality of RF assemblies based on the criteria data, plurality of first test result data, and plurality of second test result data by application of a weighting of the criteria data to prioritize the criteria data.

8. The computer program product of claim 7, wherein to determine a first plurality of combinations of the first RF modules and the second RF modules comprises a simulation of the first plurality of combinations of the first RF modules and the second RF modules as RF assemblies.

9. The computer program product of claim 7, wherein the computer-readable program instructions are further configured, upon execution, to:
determine whether the first plurality of combinations of the first RF modules and the second RF modules may be optimized based on the criteria data, plurality of first test result data, and plurality of second test result data; and
determine, based on a determination the first plurality of combinations may be optimized, a second plurality of combinations of the first RF modules and the second RF modules based on the criteria data, plurality of first test result data, and plurality of second test result data.

10. The computer program product of claim 9, wherein to determine whether the first plurality of combinations of the first RF modules and the second RF modules may be optimized comprises a simulation of the first plurality of combinations of the first RF modules and the second RF modules as RF assemblies.

11. The computer program product of claim 7, wherein the computer-readable program instructions are further configured, upon execution, to:
generate a visualization including an indication of the first plurality of combinations of the first RF modules and the second RF modules for the first plurality of RF assemblies; and
transmit, for display, the visualization in an electronic communication to a user device.

12. The computer program product of claim 7, wherein the computer-readable program instructions are further configured, upon execution, to:
determine, prior to determining a first plurality of combinations of the first RF modules and the second RF modules for a first plurality of RF assemblies, whether each of the plurality of first test result data are acceptable and each of the plurality of second test result data is acceptable; and
wherein to determine a first plurality of combinations of the first RF modules and the second RF modules for a first plurality of RF assemblies based on the plurality of first test result data and the plurality of second test result data excludes each of the first plurality of RF modules and each of the second plurality of RF modules associated with test result data that is not acceptable.

13. An apparatus comprising at least one processor and at least one memory coupled to the processor, wherein the processor is configured to:
receive a plurality of first test result data generated at one or more test stations based on tests of a plurality of first RF modules;
receive a plurality of second test result data generated at one or more test stations based on tests of a plurality of second RF modules;
receive criteria data for a combination of first RF module and second RF module for a first RF assembly; and
determine a first plurality of combinations of the first RF modules and the second RF modules for a first plurality of RF assemblies based on the criteria data, plurality of first test result data, and plurality of second test result data by an application of a weighting of the criteria data to prioritize the criteria data.

14. The apparatus of claim 13, wherein to determine a first plurality of combinations of the first RF modules and the second RF modules comprises a simulation of the first plurality of combinations of the first RF modules and the second RF modules as RF assemblies.

15. The apparatus of claim 13, wherein the processor is further configured to:
determine whether the first plurality of combinations of the first RF modules and the second RF modules may be optimized based on the criteria data, plurality of first test result data, and plurality of second test result data; and
determine, based on a determination the first plurality of combinations may be optimized, a second plurality of combinations of the first RF modules and the second RF modules based on the criteria data, plurality of first test result data, and plurality of second test result data.

16. The apparatus of claim 15, wherein to determine whether the first plurality of combinations of the first RF modules and the second RF modules may be optimized comprises a simulation of the first plurality of combinations of the first RF modules and the second RF modules as RF assemblies.

17. The apparatus of claim 13, wherein the processor is further configured to:
generate a visualization including an indication of the first plurality of combinations of the first RF modules and the second RF modules for the first plurality of RF assemblies; and
transmit, for display, the visualization in an electronic communication to a user device.

* * * * *